(12) United States Patent
Uchida et al.

(10) Patent No.: US 9,530,958 B2
(45) Date of Patent: Dec. 27, 2016

(54) MAGNETORESISTIVE ELEMENT

(71) Applicant: Sony Corporation, Tokyo (JP)

(72) Inventors: Hiroyuki Uchida, Kanagawa (JP);
Masanori Hosomi, Tokyo (JP);
Hiroyuki Ohmori, Kanagawa (JP);
Kazuhiro Bessho, Kanagawa (JP);
Yutaka Higo, Kanagawa (JP);
Kazutaka Yamane, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/607,487

(22) Filed: Jan. 28, 2015

(65) Prior Publication Data
US 2015/0221862 A1 Aug. 6, 2015

(30) Foreign Application Priority Data

Feb. 3, 2014 (JP) .................................. 2014-018280

(51) Int. Cl.
*H01L 29/82* (2006.01)
*H01L 43/10* (2006.01)
*H01L 43/08* (2006.01)
*H01L 27/22* (2006.01)

(52) U.S. Cl.
CPC .............. *H01L 43/10* (2013.01); *H01L 43/08* (2013.01); *H01L 27/228* (2013.01)

(58) Field of Classification Search
CPC ......... H01L 43/10; H01L 43/08; H01L 27/228
See application file for complete search history.

(56) References Cited

U.S. PATENT DOCUMENTS

2009/0213638 A1* 8/2009 Morise .................... G11C 11/16
365/145
2010/0032780 A1* 2/2010 Ang ........................ G11C 11/16
257/421

FOREIGN PATENT DOCUMENTS

JP 2012-248688 12/2012

* cited by examiner

*Primary Examiner* — Shaun Campbell
(74) *Attorney, Agent, or Firm* — Michael Best & Friedrich LLP

(57) ABSTRACT

A magnetoresistive element includes a laminated structure including a plurality of fixed layers, an intermediate layer formed of a non-magnetic material, and a recording layer, the plurality of fixed layers being laminated via a non-magnetic layer, the plurality of fixed layers having at least a first fixed layer and a second fixed layer, the following formula being satisfied: $S_1 > S_2$ (wherein $S_1$ is an area of a portion of the first fixed layer adjacent to the intermediate layer, which faces the intermediate layer, and $S_2$ is an area of the fixed layer having the smallest area out of the fixed layers other than the first fixed layer).

16 Claims, 16 Drawing Sheets

MAGNETORESISTIVE ELEMENT

CROSS REFERENCE TO RELATED APPLICATIONS

This application claims the benefit of Japanese Priority Patent Application JP 2014-018280 filed Feb. 3, 2014, the entire contents of which are incorporated herein by reference.

BACKGROUND

The present disclosure relates to a magnetoresistive element, and more specifically, to a magnetoresistive element formed of a memory element, for example.

The magnetic random access memory (MRAM) performs the data storage using a magnetization direction of a magnetic material, so that high speed and nearly unlimited ($10^{15}$ times or more) rewriting can be made, and therefore the MRAM has already been used in fields such as industrial automation and an airplane. The MRAM is expected to be used for code storage or a working memory in the near future because of the high-speed operation and high reliability. However, the MRAM has challenges related to lowering power consumption and increasing capacity. This is a basic problem caused by the recording principle of the MRAM, i.e., the method of inverting the magnetization using a current magnetic field generated from a wiring. As a method of solving this problem, a recording method not using the current magnetic field, i.e., a magnetization inversion method, is under review. Among them, a spin injection-type magnetoresistive effect element that uses magnetization inversion by spin injection attracts attention.

The magnetization inversion by spin injection is a phenomenon in which a spin-polarized electron that has passed through a magnetic material is injected into a different magnetic material and thus, magnetization inversion is caused in the different magnetic material. The spin injection-type magnetoresistive effect element uses magnetization inversion by spin injection, and thus has such advantages that a writing current is not increased even if the size of the element is reduced, scaling is possible because a writing current value is reduced in proportion to the element volume, and the cell area can be reduced, as compared with the MRAM that performs magnetization inversion based on the external magnetic field. In addition, the spin injection-type magnetoresistive effect element does not need a word line for generating a recording current magnetic field, which is necessary in the MRAM, and thus has such an advantage that a device structure and a cell structure are simple.

Incidentally, in order to achieve a spin injection-type magnetoresistive effect element with high reliability, a reference layer (referred to also as a pinned layer) that pins the magnetization direction needs to have a sufficiently high spin torque resistance as compared with the recording layer. In addition, the reference layer needs to have a sufficiently high external magnetic field resistance to avoid unnecessary magnetization inversion of the reference layer caused due to an external magnetic field. In Japanese Patent Application Laid-open No. 2012-248688, in order to increase the spin torque resistance of the reference layer, the volume is increased by increasing the area of the reference layer with respect to the area of the recording layer.

SUMMARY

However, in the techniques disclosed in Japanese Patent Application Laid-open No. 2012-248688, because the reference layer has a single-layered configuration, resistance to an external magnetic field is low. Furthermore, because there is a need to increase the area of the reference layer with respect to the area of the recording layer, the resistance to the external magnetic field is further reduced. As a structure for increasing the external magnetic field resistance, a synthetic antiferromagnet (SAF) structure where a plurality of magnetic materials are bonded together in non-parallel to each other via a non-magnetic material has been known. However, in the case where the area of the reference layer is large, the effects obtained from the SAF structure are insufficient.

Therefore, it is desirable to provide a magnetoresistive element having a configuration and structure where the reference layer has a sufficiently high external magnetic field resistance and a sufficiently high spin torque resistance as compared with the recording layer.

According to an embodiment of the present disclosure, there is provided a magnetoresistive element including a laminated structure including a plurality of fixed layers, an intermediate layer formed of a non-magnetic material, and a recording layer, the plurality of fixed layers being laminated via a non-magnetic layer, the plurality of fixed layers having at least a first fixed layer and a second fixed layer, the following formula being satisfied: $S_1 > S_2$ (wherein $S_1$ is an area of a portion of the first fixed layer adjacent to the intermediate layer, which faces the intermediate layer, and $S_2$ is an area of the fixed layer having the smallest area out of the fixed layers other than the first fixed layer). It should be noted that the first fixed layer corresponds to the reference layer in the existing techniques. In some cases, the first fixed layer is referred to as "reference layer" and the fixed layers other than the first fixed layer is referred to as "magnetization-fixed layers" for the sake of convenience.

In a magnetoresistive element according to an embodiment of the present disclosure, because the plurality of fixed layers are provided and the following formula is satisfied: $S_1 > S_2$ ($S_1$ is an area of a portion of the first fixed layer (reference layer) adjacent to the intermediate layer, which faces the intermediate layer, and $S_2$ is an area of the fixed layer having the smallest area out of the fixed layers other than the first fixed layer (magnetization-fixed layers)), the fixed layer (more specifically, the first fixed layer) has a sufficiently high external magnetic field resistance and a sufficiently high spin torque resistance as compared with the recording layer. Therefore, it is possible to stably perform the operation of wiring information. It should be noted that the effects described herein are given for exemplary purposes and are not limited. In addition, additional effects may be provided.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments of the present disclosure will be described based on examples with reference to the drawings. However, embodiments of the present disclosure are not limited to the examples, and various numerical values or materials in the examples are given for exemplary purposes. It should be noted that a description will be made in the following order.

1. Magnetoresistive element according to embodiment of present disclosure, and general description
2. Example 1 (magnetoresistive element according to embodiment of present disclosure)
3. Example 2 (modification of example 1), and others (Magnetoresistive element according to embodiment of present disclosure, and general description)

In a magnetoresistive element according to an embodiment of the present disclosure, a plurality of fixed layers have at least a first fixed layer and a second fixed layer, as described above. Specifically, the plurality of fixed layers have at least the first fixed layer and the second fixed layer, and have the first fixed layer, the second fixed layer, and a third fixed layer in some cases. Alternatively, the plurality of fixed layers have the first fixed layer, the second fixed layer, ..., a nth (n represents a natural number of not less than 3) fixed layer. Because the side surface of the first fixed layer may be tilted, the area of a portion of the first fixed layer, which faces the intermediate layer, is defined as $S_1$. The fixed layer having the smallest area is the second fixed layer (magnetization-fixed layers) in the case where the fixed layers have a two-layered configuration, and is any one of layers from the second fixed layer to the nth fixed layer (magnetization-fixed layers) in the case where the fixed layers include three or more layers. "The following formula is satisfied: $S_1 > S_2$" represents that there is a fixed layer (magnetization-fixed layers) having the area smaller than the area $S_1$ of a portion of the first fixed layer (reference layer) adjacent to the intermediate layer, which faces the intermediate layer.

Figure 16A:
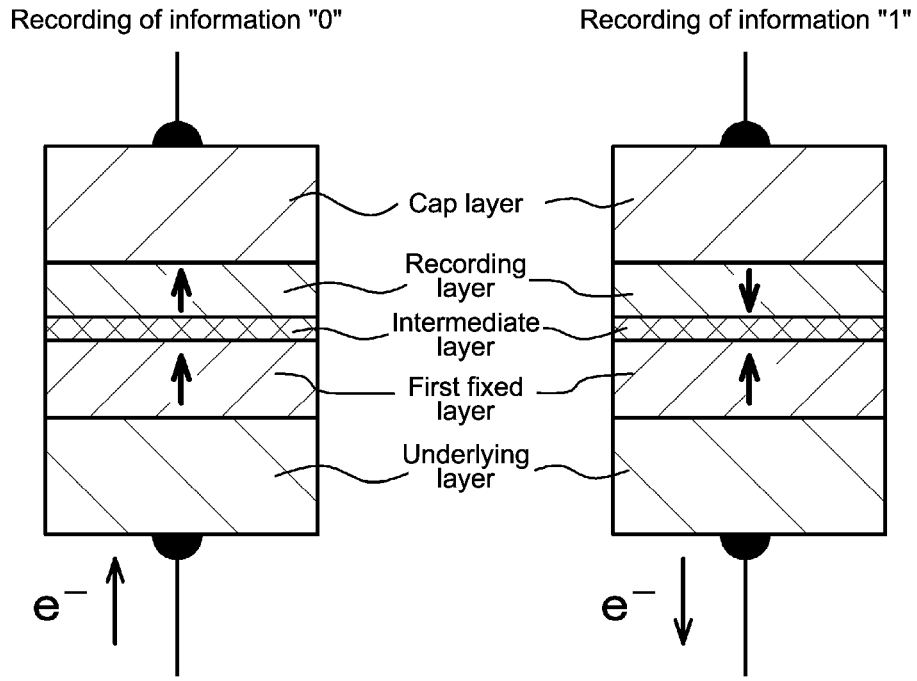
FIGS. 16A and 16B are a conceptual diagram showing a spin injection-type magnetoresistive effect element to which spin injection magnetization inversion is applied and a conceptual diagram showing a spin injection-type magnetoresistive effect element having a double spin filter structure, respectively.
Figure 16B:
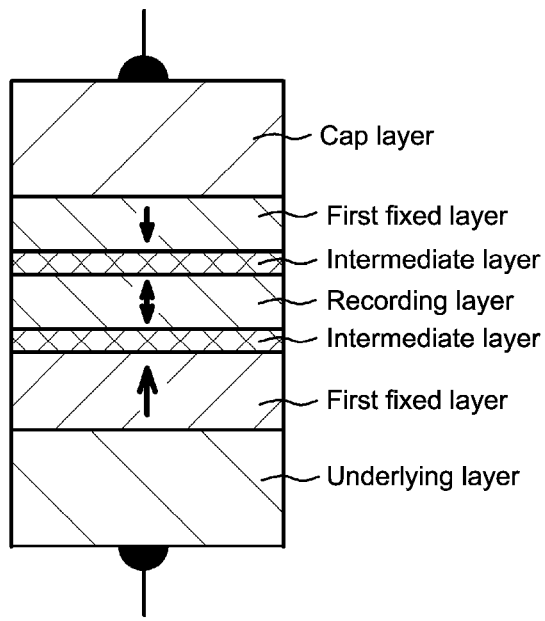

With a laminated structure of the recording layer, the intermediate layer, and the fixed layers, the magnetoresistive element according to an embodiment of the present disclosure can have a structure where a laminated structure having a TMR effect or GMR effect is configured. Then, as shown in the conceptual diagram of FIG. 16A, if a writing current (hereinafter, referred to as "spin polarized current" in some cases) flows from the recording layer to the fixed layers in a magnetization state of antiparallel arrangement, the magnetization of the recording layer is inverted by spin torque that operates with an electron being injected from the fixed layer into the recording layer, and the magnetization direction of the recording layer and the magnetization direction of the fixed layer (specifically, the first fixed layer) are arranged in parallel to each other. On the other hand, if the spin polarized current flows from the fixed layer to the recording layer in a magnetization state of parallel arrangement, the magnetization of the recording layer is inverted by spin torque that operates with an electron being injected from the recording layer into the fixed layer, and the magnetization direction of the recording layer and the magnetization direction of the fixed layer (specifically, the first fixed layer) are arranged in antiparallel to each other. Alternatively, as shown in the conceptual diagram of FIG. 16B, with a laminated structure of a plurality of fixed layers, the intermediate layer, the recording layer, the intermediate layer, and a plurality of fixed layer, the laminated structure having a TMR effect or GMR effect may be configured. Such a structure needs to make a difference between changes in magnetic resistances of the two intermediate layers located above and under the recording layer. The laminated structure having a TMR effect that is configured with the fixed layer, the intermediate layer, and the recording layer is a structure where the intermediate layer formed of a non-magnetic film that functions as a tunneling insulating film is sandwiched between the fixed layer formed of a magnetic material and the recording layer formed of a magnetic material. It should be noted that in FIG. 16A and FIG. 16B, the fixed layers other than the first fixed layer (magnetization-fixed layers) are not shown.

In the magnetoresistive element according to an embodiment of the present disclosure, it is desirable that the plurality of fixed layers have a laminated ferrimagnetic structure (referred to also as laminated ferri-pinned structure). The laminated ferrimagnetic structure will be described later.

In the magnetoresistive element according to an embodiment of the present disclosure including the above-mentioned favorable embodiment, it is desirable that the following formula is satisfied: $S_1/S_2 \geq 4$.

In the magnetoresistive element according to an embodiment of the present disclosure including the above-mentioned favorable embodiment, an uneven surface may be formed between a surface of the first fixed layer that faces the second fixed layer and a surface of the second fixed layer that faces the first fixed layer.

The magnetoresistive element according to an embodiment of the present disclosure including the above-mentioned favorable embodiment may be formed of a memory element (specifically, non-volatile magnetic memory element, more specifically, spin injection-type magnetoresistive effect element) in which a magnetization direction of the recording layer (referred to also as magnetization inversion layer or free layer) changes corresponding to information to be recorded, a magnetization direction of the first fixed layer is one that is reference of information to be recorded in the recording layer, and the magnetization direction of the recording layer is changed by flowing current in a laminated direction of the laminated structure and information is recorded in the recording layer.

Furthermore, in the magnetoresistive element according to an embodiment of the present disclosure including the above-mentioned favorable embodiment, in the recording layer, an easy axis of magnetization may be in parallel with the laminated direction of the laminated structure (i.e., the magnetoresistive element is vertical magnetization-type), or may be vertical to the laminated direction of the laminated structure (i.e., the magnetoresistive element is in-plane magnetization-type).

Furthermore, in the magnetoresistive element according to an embodiment of the present disclosure including the above-mentioned favorable embodiment, the area of the recording layer is favorably smaller than the area of the first fixed layer (reference layer) although it is not limited thereto. Specifically, it is desirable that the following formula is satisfied: $S_1/S_3 \geq 4$ ($S_3$ represent the area of the recording layer).

Furthermore, in the magnetoresistive element according to an embodiment of the present disclosure including the above-mentioned favorable embodiment, at least the second fixed layer (magnetization-fixed layers) may be surrounded by an insulating material layer. In this case, the insulating material layer may have magnetic properties. It should be noted that examples of the material constituting the insulating material layer include an aluminum oxide ($AlO_X$), a silicon oxide ($SiO_X$), a silicon nitride (SiN), a ferric oxide ($FeO_X$), and a laminated body or compound thereof, and examples of the material constituting the insulating material layer having magnetic properties include a ferric oxide ($FeO_X$).

Furthermore, in the magnetoresistive element according to an embodiment of the present disclosure including the above-mentioned favorable embodiment, the non-magnetic layer that is in contact with the first fixed layer (reference layer) may have the same size as the second fixed layer, or the non-magnetic layer that is in contact with the first fixed layer (reference layer) may have the same size as the first fixed layer.

Furthermore, in the magnetoresistive element according to an embodiment of the present disclosure including the above-mentioned favorable embodiment, the fixed layers (magnetization-fixed layers) other than the first fixed layer (reference layer) may have a plurality of arranged fixed layer units.

Examples of the material constituting the first fixed layer (reference layer) include a material constituting the recording layer to be described later (ferrimagnetic material). Alternatively, the first fixed layer (reference layer) may be formed of a laminated body of a Co layer and a Pt layer, a laminated body of a Co layer and a Pd layer, a laminated body of a Co layer and a Ni layer, a laminated body of a Co layer and a Tb layer, a Co—Pt alloy layer, a Co—Pd alloy layer, a Co—Ni alloy layer, a Co—Fe alloy layer, a Co—Tb alloy layer, a Co layer, a Fe layer, or a Co—Fe—B alloy layer. Alternatively, a non-magnetic element such as Ag, Cu, Au, Al, Si, Bi, Ta, B, C, O, N, Pd, Pt, Zr, Hf, Ir, W, Mo, and Nb may be added to these materials to adjust the magnetic properties or various types of physical properties such as a crystalline structure, crystallinity, and stability of the material. Furthermore, it is favorable that the first fixed layer (reference layer) may be formed of a Co—Fe—B alloy layer. Because the magnetization direction of the first fixed layer is a reference of information, the magnetization direction should not change by recording or reading of information.

However, the magnetization direction does not necessarily need to be fixed in a specific direction, and the first fixed layer only needs to have a configuration and structure where the magnetization direction of the first fixed layer is hard to change than that of the recording layer by having a larger coercive force, a larger film thickness, or a larger magnetic damping constant than the recording layer. The structure including a plurality of fixed layers is referred to as a laminated ferrimagnetic structure. The laminated ferrimagnetic structure is a laminated structure having a ferrimagnetic coupling, i.e., an interlayer exchange coupling between two magnetic material layers is ferrimagnetic, which is referred to also as synthetic antiferromagnet (SAF). The laminated ferrimagnetic structure represents a structure where an interlayer exchange coupling between two magnetic material layers is anti-ferromagnetic or ferrimagnetic depending on the thickness of the non-magnetic layer, and is reported in, for example, S. S. Parkin et. al, Physical Review Letters, 7 May, pp 2304-2307 (1990). Each layer constituting the fixed layers (magnetization-fixed layers) other than the first fixed layer (reference layer) is formed of any one of the materials described as the material constituting the first fixed layer (reference layer) or an anti-ferrimagnetic material, or has a laminated structure of a material layer constituting the first fixed layer (reference layer) and anti-ferrimagnetic material layer (structure where a material layer constituting the first fixed layer and an anti-ferrimagnetic material layer is in contact with each other). Specific examples of the anti-ferrimagnetic material include an iron-manganese alloy, a nickel-manganese alloy, a platinum-manganese alloy, a platinum-chromium-manganese alloy, an iridium-manganese alloy, a rhodium-manganese alloy, a cobalt oxide, a nickel oxide, and a ferric oxide ($Fe_2O_3$).

Examples of the material constituting the non-magnetic layer include ruthenium (Ru), an alloy thereof, Os, Re, Ir, Au, Ag, Cu, Al, Bi, Si, B, C, Cr, Ta, Pd, Pt, Zr, Hf, W, Mo, Nb, and an alloy thereof.

It is favorable that the intermediate layer is formed of a non-magnetic film. Specifically, in the spin injection-type magnetoresistive effect element, it is favorable that the intermediate layer includes a non-magnetic film formed of an insulating material in the case where the laminated structure having a TMR effect is configured. It should be noted that examples of the material constituting the non-magnetic film formed of an insulating material include various insulating materials, dielectric materials, and semiconductor materials, such as a magnesium oxide (MgO), a magnesium nitride, a magnesium fluoride, an aluminum oxide ($AlO_X$), an aluminum nitride (AlN), a silicon oxide ($SiO_X$), a silicon nitride (SiN), $TiO_2$, $Cr_2O_3$, Ge, NiO, $CdO_X$, $HfO_2$, $Ta_2O_5$, $Bi_2O_3$, CaF, $SrTiO_2$, $AlLaO_3$, Al—N—O, BN, and ZnS. On the other hand, examples of the material of the non-magnetic film constituting the laminates structure having a GMR effect include a conductive material such as Cu, Ru, Cr, Au, Ag, Pt, Ta, and an alloy thereof. If the conductivity is high (resistance is not more than several hundred μΩ·cm), any non-metal material may be used. However, it is favorable to appropriately select a material that has a difficulty in causing an interface reaction with the recording layer or the first fixed layer.

The intermediate layer formed of an insulating material can be obtained by oxidizing or azotizing a metal film formed by a sputtering method, for example. More specifically, in the case where an aluminum oxide ($AlO_X$) or a magnesium oxide (MgO) is used as the insulating material constituting the intermediate layer, a method of oxidizing aluminum or magnesium formed by a sputtering method in the atmosphere, a method of plasma-oxidizing aluminum or magnesium formed by a sputtering method, a method of oxidizing aluminum or magnesium formed by a sputtering method with IPC plasma, a method of naturally oxidizing aluminum or magnesium formed by a sputtering method in oxygen, a method of oxidizing aluminum or magnesium formed by a sputtering method with an oxygen radical, a method of naturally oxidizing aluminum or magnesium formed by a sputtering method in oxygen when ultraviolet rays are irradiated, a method of depositing aluminum or magnesium by a reactive sputtering method, and a method of depositing an aluminum oxide ($AlO_X$) or a magnesium oxide (MgO) by a sputtering method can be used, for example.

Examples of the material constituting the recording layer include an alloy of ferrimagnetic materials such as nickel (Ni), iron (Fe), and cobalt (Co) (e.g., Co—Fe, Co—Fe—B, Co—Fe—Ni, Fe—Pt, and Ni—Fe), and an alloy obtained by adding gadolinium (Gd) to these alloys. Furthermore, in the case of a perpendicular magnetization-type, in order to further increase a perpendicular magnetic anisotropy, heavy rare earths such as terbium (Tb), dysprosium (Dy), and holmium (Ho) may be added to such an alloy, or an alloy including such heavy rare earths may be laminated. The recording layer may have any crystallinity basically, and may be polycrystalline, single crystalline, or amorphous. In addition, the recording layer may have a single-layered configuration, may have a laminated configuration where the plurality of ferrimagnetic material layers are laminated, or a laminated configuration where a ferrimagnetic material layer and a non-magnetic material layer are laminated.

Various layers described above can be formed by a sputtering method, an ion beam deposition method, a physical vapor deposition (PVD) method exemplified by a vacuum evaporation method, or a chemical vapor deposition (CVD) method typified by an atomic layer deposition (ALD) method. Moreover, the patterning of these layers can be performed by a reactive ion etching (RIE) method or an ion milling method (ion beam etching method). It is favorable that various layers are successively formed in a vacuum apparatus, and after that, patterning is performed on the layers.

The magnetoresistive element according to an embodiment of the present disclosure including the above-mentioned favorable embodiments (hereinafter, referred to collectively as "magnetoresistive element or the like according to this embodiment") may include a first wiring electrically connected to the lower portion of the laminated structure and a second wiring electrically connected to the upper portion of the laminated structure.

The three-dimensional shape of the laminated structure is favorably a cylinder shape or a columnar shape from a viewpoint of ensuring the easiness of processing, the uniform direction of an easy axis of magnetization in the recording layer, or the like. However, the three-dimensional shape of the laminated structure is not limited thereto, and may be a triangular prism shape, a quadrangular prism shape, a hexagonal prism shape, an octagonal prism shape (including those having a round corner or a round lateral edge), or an elliptic cylinder shape. By flowing spin polarized current from the first wiring to the second wiring or from the second wiring to the first wiring through the laminated structure, the magnetization direction in the recording layer becomes the first direction (direction in parallel with an easy axis of magnetization) or the second direction (direction opposite to the first direction) to write information in the recording layer. Between the laminated structure and the wiring, an underlying film formed of Ta, Cr, Ru, Ti, or the like may be formed to improve the crystallinity of the magnetic layer that is in contact with the wiring of the laminated structure.

The first wiring or the second wiring may have a single-layered structure including Cu, Al, Au, Pt, Ti, or the like, or may have a laminated structure of an underlying layer formed of Cr or Ti, and a Cu layer, an Au layer, a Pt layer, or the like formed thereon. Furthermore, the first wiring or the second wiring may have a single-layered structure including Ta or the like, a laminated structure including Cu and Ti, or the like. These wirings can be formed by a PVD method exemplified by a sputtering method, for example.

Between the recording layer and the wiring, a cap layer is favorably formed to prevent atoms constituting the wiring or connection portion and atoms constituting the recording layer from mutually diffusing, contact resistance from reducing, and the recording layer from being oxidized. The cap layer may include a Ta layer, a Ru layer, a Pt layer, a Ti layer, a W layer, or an MgO layer, or may have a laminated structure of a Ru film/Ta film.

The magnetoresistive element or the like according to this embodiment further includes a selection transistor formed of an electric field effect transistor at the lower side of the laminated structure. The direction in which the second wiring (e.g., bit line) extends is favorably in parallel with the direction in which a gate electrode constituting an electric field effect transistor extends. However, the direction is not limited thereto, and the projected image of the direction in which the second wiring extends may be perpendicular to the projected image of the direction in which the gate electrode constituting an electric field effect transistor extends. Moreover, in some cases, the selection transistor is unnecessary.

The magnetoresistive element having a favorable configuration further includes a selection transistor formed of an electric field effect transistor at the lower side of the laminated structure, as described above.

However, as a more specific configuration, the magnetoresistive element may further include a selection transistor formed on a semiconductor substrate, and a lower insulating layer that covers the selection transistor, the first wiring being formed on the lower insulating layer, the first wiring being electrically connected to the selection transistor via a connection hole provided in the lower insulating layer (or a connection hole and a landing pad portion or a lower layer wiring), an interlayer insulating layer including the insulating material layer covering the lower insulating layer and the first wiring, the interlayer insulating layer surrounding the laminated structure, the second wiring being formed on the interlayer insulating layer, for example. However, the magnetoresistive element is not limited thereto.

The selection transistor can be configured of a well-known metal insulator semiconductor (MIS)-type field effect transistor (FET) or metal oxide semiconductor (MOS)-type FET. The connection hole that electrically connects the first wiring and the selection transistor may be formed of polysilicon on which an impurity is doped, a metal having a high melting point such as tungsten, Ti, Pt, Pd, Cu, TiW, TiNW, $WSi_2$, and $MoSi_2$, or a metal silicide, and can be formed based on a CVD method or a PVD method exemplified by a sputtering method. Moreover, examples of the material constituting the lower insulating layer include a silicon oxide ($SiO_2$), a silicon nitride (SiN), SiON, SOG, NSG, BPSG, PSG, BSG, and LTO.

EXAMPLE 1

An example 1 relates to a magnetoresistive element according to an embodiment of the present disclosure. As shown in schematic partial cross-sectional views of FIG. 1A and FIG. 2, a magnetoresistive element 10 in the example 1 has a laminated structure 20 including a plurality of fixed layers 30, an intermediate layer 22, and a recording layer 21. The plurality of fixed layers 30 are laminated via a non-magnetic layer 34, and include at least a first fixed layer 31 and a second fixed layer 32. The following formula is satisfied: $S_1 > S_2$ ($S_1$ represents the area of a portion 31A of the first fixed layer (reference layer) 31 adjacent to the intermediate layer 22, which faces the intermediate layer 22, and $S_2$ represents the area of the fixed layer having the smallest area out of the fixed layers other than the first fixed layer 31 (magnetization-fixed layers)). Favorably, the following formula is satisfied: $S_1/S_2 \geq 4$. Specifically, there is a magnetization-fixed layer having the area smaller than the area $S_1$ of the portion 31A of the first fixed layer 31 adjacent to the intermediate layer 22, which faces the intermediate layer 22. It should be noted that in the magnetoresistive element in the example 1, the fixed layers other than the first fixed layer 31 (magnetization-fixed layers) includes a layer of the second fixed layer 32. The laminated structure 20 includes, specifically, the second fixed layer 32, the non-magnetic layer 34, the first fixed layer 31, the intermediate layer 22, and the recording layer 21. Moreover, the area of the recording layer 21 is smaller than the area of the first fixed layer 31, and the non-magnetic layer 34 that is in contact with the first fixed layer 31 has the same size as the second fixed layer 32. Specifically, the following formula is satisfied: $S_1/S_3 \geq 4$ ($S_3$ represents the area of the recording layer 21).

Figure 1A:
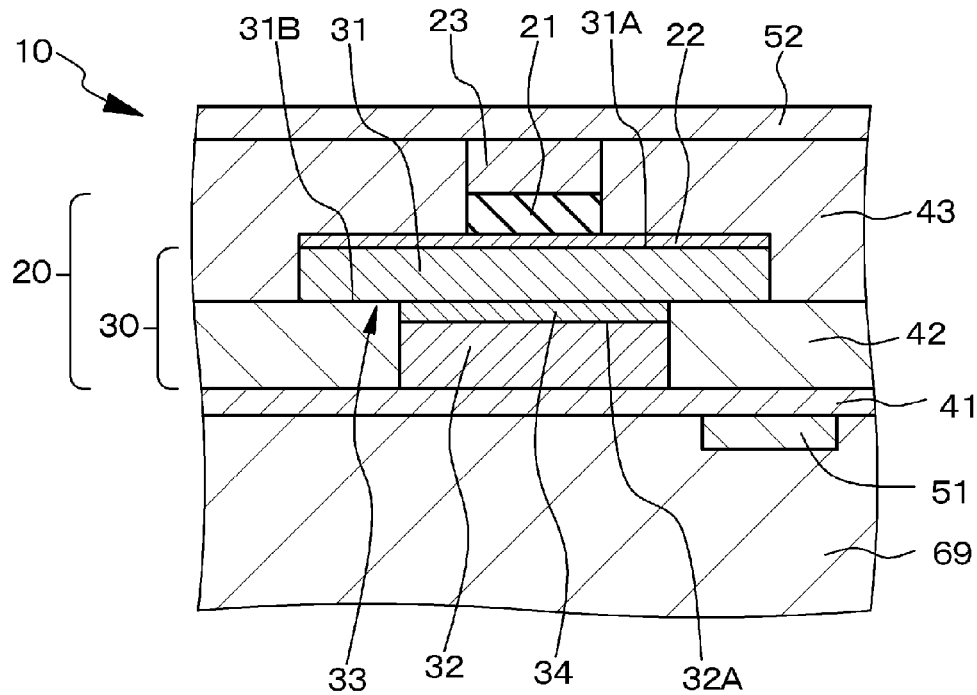
FIGS. 1A and 1B are each a schematic partial cross-sectional view showing a magnetoresistive element (spin injection-type magnetoresistive effect element) in an example 1.
Figure 1B:
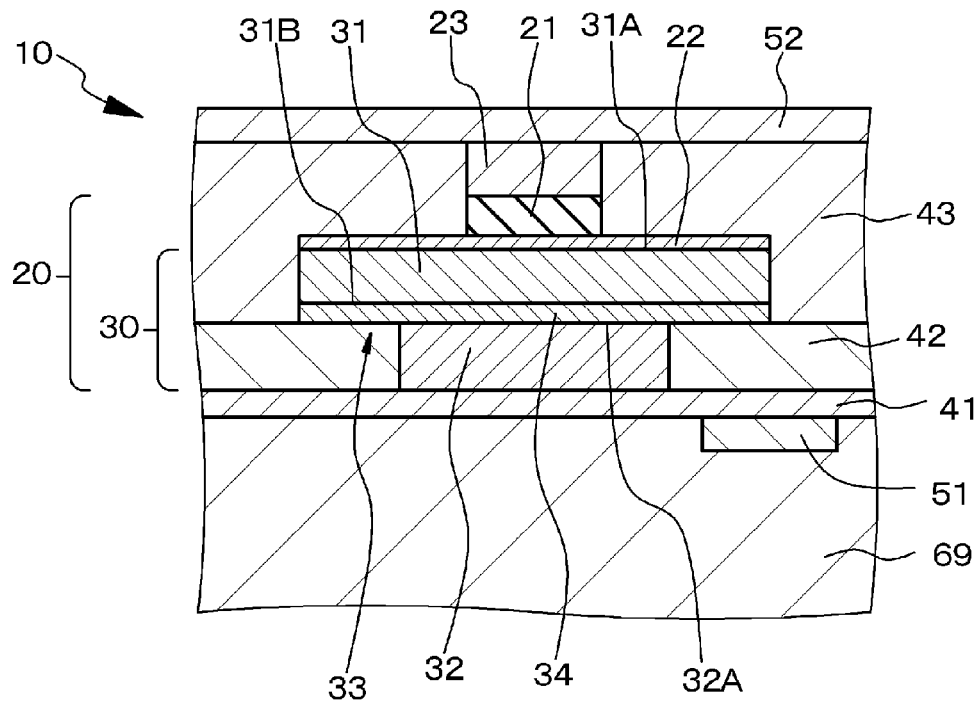

It should be noted that as shown in FIG. 1B, the non-magnetic layer 34 that is in contact with the first fixed layer 31 may have the same size as the first fixed layer 31.

Then, between a surface 32B of the first fixed layer 31, which faces the second fixed layer 32, and a surface 32A of the second fixed layer 32, which faces the first fixed layer 31, an uneven surface 33 is formed.

The magnetoresistive element 10 in the example 1 may be specifically formed of a memory element (specifically, non-volatile magnetic memory element, more specifically, spin injection-type magnetoresistive effect element) in which a magnetization direction of the recording layer 21 (referred to also as magnetization inversion layer or free layer) changes corresponding to information to be recorded, a magnetization direction of the first fixed layer (reference layer) 31 is one that is reference of information to be recorded in the recording layer 21, the magnetization direction of the recording layer 21 is changed by flowing current in a laminated direction of the laminated structure 20, and information is recorded in the recording layer 21. Specifically, information "0" and information "1" are defined by the relative angle of the magnetization direction of the recording layer 21 and the magnetization direction of the first fixed layer (reference layer) 31.

In the laminated structure 20, a fixed layer 30 is located at the lower side and the recording layer 21 is located at the upper side. However, it is not limited thereto. Moreover, the three-dimensional shape of the laminated structure 20 is, but not limited to, a cylinder shape (columnar shape) or a quadrangular prism shape. A first wiring 51 is electrically connected to the lower portion of the laminated structure 20, and a second wiring 52 is electrically connected to the upper portion of the laminated structure 20. More specifically, the first wiring 51 is connected to the lower end of the fixed layer 30 (more specifically, the second fixed layer 32), and the second wiring 52 is connected to the recording layer 21 via a cap layer 23.

In the example 1, an easy axis of magnetization in the recording layer 21 is in parallel with the laminated direction of the laminated structure 20. Specifically, the recording layer 21 is formed of a ferrimagnetic material having a magnetic moment in which the magnetization direction freely changes in the laminated direction of the laminated structure 20, more specifically, a Co—Fe—B alloy ($(Co_{20}Fe_{80})_{80}B_{20}$). The intermediate layer 22 formed of a non-magnetic material is formed of an insulating layer that functions as a tunnel barrier layer (tunnel insulating layer), specifically, an MgO layer. By forming the intermediate layer 22 with an MgO layer, a magnetoresistance change ratio (MR ratio) can be increased, thereby improving the efficiency of spin injection and reducing the current density that is necessary for inverting the magnetization direction of the recording layer 21. An easy axis of magnetization in the first fixed layer (reference layer) 31 is in parallel with the laminated direction of the laminated structure 20. Specifically, the first fixed layer (reference layer) 31 is formed of a ferrimagnetic material having a magnetic moment in which the magnetization direction freely changes in the laminated direction of the laminated structure 20, more specifically, a Co—Fe—B alloy ($(Co_{20}Fe_{80})_{80}B_{20}$). Furthermore, the second fixed layer (magnetization reference layer) 32 is formed of a Co—Pt alloy layer, and constitutes a laminated ferrimagnetic structure where the second fixed layer 32 magnetically binds to the first fixed layer (reference layer) 31 via the non-magnetic layer 34 formed of ruthenium (Ru). Moreover, at least the second fixed layer 32, specifically, the second fixed layer 32 and the non-magnetic layer 34 in the example 1 are surrounded by an insulating material layer (embedding layer) 42 formed of silicon nitride (SiN), $SiO_2$, or $Al_2O_3$. Moreover, on the insulating material layer 42, an interlayer insulating layer 43 formed of an aluminum oxide is formed, and the first fixed layer 31, the intermediate layer 22, the recording layer 21, and the cap layer 23 are surrounded by the interlayer insulating layer 43. Moreover, the second fixed layer 32 and the insulating material layer 42 are formed on an underlying layer 41 having a two-layered structure of a Ta layer and a Ru layer, for example. The underlying layer 41 is formed on a lower insulating layer 69 formed of $SiO_2$. As described above, the magnetoresistive element in the example 1 is formed of a magnetic tunnel junction (MTJ) element.

Figure 2:
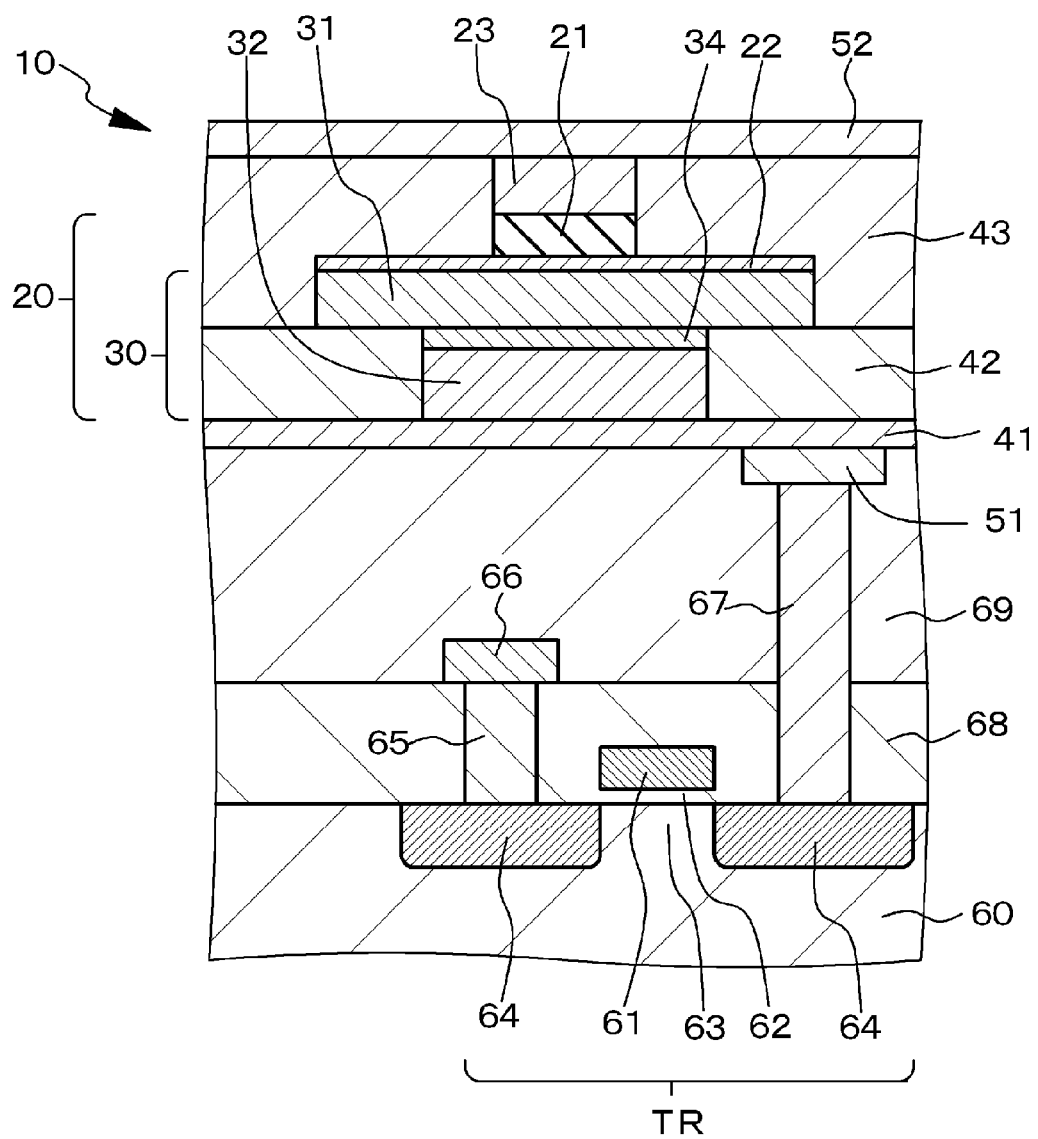
FIG. 2 is a schematic partial cross-sectional view showing a magnetoresistive element (spin injection-type magnetoresistive effect element) including a selection transistor in the example 1.

As shown in FIG. 2, a selection transistor TR formed of an electric field effect transistor is provided to the lower side of the laminated structure 20. Specifically, the magnetoresistive element 10 includes the selection transistor TR formed on a semiconductor substrate 60 and lower insulating layers 68 and 69, the first wiring 51 is formed on the lower insulating layer 69, the first wiring 51 is electrically connected to the selection transistor TR via a connection hole (or a connection hole and a landing pad portion or a lower layer wiring) provided to the lower insulating layers 68 and 69, the interlayer insulating layer 43 including the insulating material layer 42 covers the lower insulating layer 69 and the first wiring 51, and surrounds the laminated structure 20, and the second wiring 52 is formed on the interlayer insulating layer 43.

The selection transistor TR includes a gate electrode 61, a gate insulating layer 62, a channel forming area 63, and source/drain areas 64. One source/drain area 64 and the first wiring 51 are connected to each other via a connection hole 67 as described above, and the other source/drain area 64 is connected to a sense line 66 formed on a lower insulating layer 68 via a tungsten plug 65. The gate electrode 61 functions as a so-called word line.

Hereinafter, the overview of a method of producing a magnetoresistive element in the example 1 will be described. However, a magnetoresistive element in an example 2 can be produced with a method similar to the production method basically.
(Process-100)

First, based on a well-known method, an element separation area (not shown) is formed in the silicon semiconductor substrate 60, and the selection transistor TR including the gate insulating film 62, the gate electrode 61, and the source/drain area 64 is formed in a portion of the silicon semiconductor substrate 60 surrounded by the element separation area. A portion of the silicon semiconductor substrate 60 located between one source/drain area 64 and the other source/drain area 64 corresponds to the channel forming area 63. Next, a first lower insulating layer 68 is formed, the tungsten plug 65 is formed on a portion of the first lower insulating layer 68 on the upper side of the other source/drain area 64, and the sense line 66 is formed on the first lower insulating layer 68. After that, a second lower insulating layer 69 is formed on the entire surface, and the connection hole 67 including a tungsten plug is formed in a portion of the lower insulating layers 68 and 69 on the upper side of the one source/drain area 64. In this way, the selection transistor TR covered by the lower insulating layers 68 and 69 can be obtained. After that, the first wiring 51 is formed on the lower insulating layer 69.

(Process-110)

After that, the underlying layer 41, the second fixed layer 32, and the non-magnetic layer 34 are continuously deposited on the entire surface by a sputtering method. Next, the non-magnetic layer 34, the second fixed layer 32, and the underlying layer 41 are etched based on a reactive ion etching (RIE) method.
(Process-120)

Next, the insulating material layer 42 is formed on the entire surface, and a planarization process is applied to the insulating material layer 42. Thus, the top surface of the insulating material layer 42 is at the same level as the top surface of the non-magnetic layer 34.
(Process-130)

After that, the first fixed layer 31 and the intermediate layer 22 are formed on the entire surface by a sputtering method before an oxidation process is applied to the intermediate layer 22. Next, the recording layer 21 and the cap layer 23 are deposited on the intermediate layer 22 before the cap layer 23, the recording layer 21, the intermediate layer 22, and the first fixed layer 31 are etched based on a reactive ion etching method. Furthermore, the cap layer 23 and the recording layer 21 are etched based on a reactive ion etching method.
(Process-140)

After that, the interlayer insulating layer 43 is formed on the entire surface, an opening is formed in the interlayer insulating layer 43 on the upper side of the cap layer 23, and the second wiring 52 that extends to the cap layer 23 is formed on the interlayer insulating layer 43. Thus, a magnetoresistive element having the structure shown in FIG. 1A and FIG. 2 (specifically, spin injection-type magnetoresistive effect element) can be obtained. It should be noted that instead of patterning each layer by an RIE method, each layer can be patterned based on an ion milling method (ion beam etching method).

Incidentally, information is defined by the magnetization direction of the recording layer 21 having uniaxial anisotropy. Information is written by flowing current in the laminated direction of the laminated structure 20 to cause a spin torque magnetization inversion. Hereinafter, a spin torque magnetization inversion will be simply described with reference to FIG. 16A being a conceptual diagram of a spin injection-type magnetoresistive effect element to which a spin injection magnetization inversion is applied. An electron has two types of spin angular momentum. The two types of spin angular momentum are temporarily defined as an upward direction and a downward direction. A non-magnetic material includes the same number of the upward direction and the downward direction, and a ferrimagnetic material has a different number of the upward direction and the downward direction.

The directions of magnetic moment of the recording layer 21 and the first fixed layer (reference layer) 31, which are formed of a ferrimagnetic material, are assumed to be in antiparallel to each other. In this state, information "1" is stored in the recording layer. The assumption is made that the information "1" stored in the recording layer 21 is rewritten to "0." In this case, a spin polarized current flows from the recording layer 21 to the fixed layer 30. Specifically, an electron flows from the fixed layer 30 to the recording layer 21. The electron that has passed through the first fixed layer 31 is spin polarized, i.e., the number of the upward direction is different from the number of the downward direction. If the thickness of the intermediate layer 22 is sufficiently thin and the electron reaches the recording layer 21 before the spin polarization is weakened and the state changes to a non-polarized state in a normal non-magnetic material (the number of the upward direction is the same as the downward direction), the energy in the entire system is reduced because the sign of the spin polarization degree is reversed. Therefore, a part of the electrons is inverted, i.e., the direction of spin angular momentum is changed. At this time, because the total angular momentum of the system needs to be stored, reaction that is equal to the sum of the angular momentum change of the electron whose direction is changed is given to the magnetic moment in the recording layer 21. In the case where current, i.e., the number of electrons that pass through the laminated structure 20 in a unit time is few, the total number of electrons whose direction is changed is also few. Also, the angular momentum change generated in the magnetic moment in the recoding layer 21 is few. However, if current is increased, a lot of angular momentum change can be given to the recording layer in a unit time. The time change of angular momentum is a torque, and the magnetic moment of the recording layer 21 is started to be inverted if the torque exceeds a certain threshold value and becomes stable when it is rotated about 180 degrees due to the uniaxial anisotropy. Specifically, inversion from antiparallel state to parallel state is caused, and information "0" is stored in the recording layer (see the left conceptual diagram of FIG. 16A).

Next, the assumption is made that the information "0" stored in the recording layer 21 is rewritten to "1." In this case, spin polarized current flows from the fixed layer 30 to the recording layer 21. Specifically, electrons flow from the recording layer 21 to the fixed layer 30. The electron that has reached the first fixed layer (reference layer) 31 and has spin in the downward direction passes through the fixed layer 30. On the other hand, the electron having spin in the upward direction is reflected by the first fixed layer (reference layer) 31. Then, if such an electron enters the recording layer 21, a torque is given to the recording layer 21, and the recording layer 21 is inverted to an antiparallel state (see the right conceptual diagram of FIG. 16A). It should be noted that at this time, the amount of current that is necessary for causing inversion is larger than that in the case of the inversion from antiparallel state to parallel state. It is difficult to intuitively understand the inversion from parallel state to antiparallel state. However, it may be possible to think that because the magnetization direction of the first fixed layer (reference layer) 31 is fixed and is not able to be inverted, the recording layer 21 is inverted to store the angular momentum of the entire system. As described above, recording of information of 0/1 is performed by flowing current having not less than a certain threshold value corresponding to the polarity in the direction from the fixed layer 30 to the recording layer 21 or the opposite direction thereof.

If the inversion current in the perpendicular magnetization-type spin injection-type magnetoresistive effect element is represented by $I_{c\_perp}$ and the inversion current in the in-plane magnetization-type spin injection-type magnetoresistive effect element is represented by $I_{c\_para}$, the following formulae are satisfied:

the inversion from parallel state to antiparallel state in the perpendicular magnetization-type $I_{c\_perp}=(A\times\alpha\times M_s\times V/g (0)/P) (H_k-4\pi M_s)$;

the inversion from antiparallel state to parallel state in the perpendicular magnetization-type $I_{c\_perp}=-(A\times\alpha\times M_s\times V/g(\pi)/P)(H_k-4\pi M_s)$;

the inversion from parallel state to antiparallel state in the in-plane magnetization-type $I_{c\_para}=(A\times\alpha\times M_s\times V/g (0)/P)(H_k+2\pi M_s)$; and the inversion from antiparallel state to parallel state in the in-plane magnetization-type $I_{c\_para}=-(A\times\alpha\times M_s\times V/g (\pi)/P)(H_k+2\pi M_s)$ (A: constant α: damping constant $M_s$: saturated magnetization V: element volume g(0): constant corresponding to the efficiency at which the spin torque is transmitted to the other magnetic layer in the parallel state g(π): constant corresponding to the efficiency at which the spin torque is transmitted to the other magnetic layer in the antiparallel state P: spin polarizability $H_k$: magnetic anisotropy (anisotropy magnetic field). It should be noted that regarding these formulae, see S. Mangin et al. Nature materials, Vol. 5 March 2006, p. 210.

In the formulae, when ($H_k-4\pi M_s$) in the case of the perpendicular magnetization-type is compared to ($H_k+2\pi M_s$) in the in-plane magnetization-type, it can be understood that the perpendicular magnetization-type is suitable for reducing recording current. Specifically, a magnetoresistive element having a perpendicular magnetic anisotropy is more suitable for lowering power-consumption and increasing capacity than a magnetoresistive element having an in-plane magnetic anisotropy. This is because the perpendicular magnetization-type has lower energy barrier that should be exceeded during a spin torque magnetization inversion and a high magnetic anisotropy of a perpendicular magnetization film is advantageous for holding the thermal stability of the recording layer (recording carrier) that is miniaturized due to the increase in capacity.

In the example 1, in particular, the composition of the recording layer 21 is adjusted so that the size of the effective diamagnetic field received by the recording layer 21 is smaller than a saturated magnetization amount $M_s$ of the recording layer 21. Specifically, as described above, a ferrimagnetic material constituting the recording layer 21 is a Co—Fe—B alloy, thereby reducing the size of the effective diamagnetic field received by the recording layer 21 to be smaller than the saturated magnetization amount $M_s$ of the recording layer 21. Accordingly, it is possible to reduce the amount of writing current that is necessary for inverting the magnetization direction of the recording layer 21.

In the example 1 and comparative examples 1A and 1B to be described later, the laminated structure 20 is configured of layers shown in the following table 1.

TABLE 1

| Cap layer 23: | Ta layer having a film thickness of 5 nm |
|---|---|
| Recording layer 21: | $(Co_{20}Fe_{80})_{80}B_{20}$ layer having a film thickness of 1.6 nm |
| Intermediate layer 22: | MgO layer having a film thickness of 1.0 nm |
| First fixed layer 31: | $(Co_{20}Fe_{80})_{80}B_{20}$ layer having a film thickness of 1.2 nm |
| Non-magnetic layer 34: | Ru layer having a film thickness of 0.7 nm |
| Second fixed layer 32: | Co—Pt alloy layer having a film thickness of 2.0 nm |
| Underlying layer 41: | Two-layered structure of Ta layer having a film thickness of 10 nm and a Ru layer having a film thickness of 10 nm |

Then, in preparing a sample in the example 1, a thermally-oxidized film having a thickness of 0.3 μm (not shown) was formed on the surface of a silicon semiconductor substrate having a thickness of 0.725 mm, a Cu layer (first wiring) 51 that functioned as a word line (first wiring) and had a film thickness of 0.1 μm was formed thereon, and the underlying layer 41, the second fixed layer 32, and the non-magnetic layer 34 out of the laminated structure 20 shown in Table 1 were formed thereon before the non-magnetic layer 34 and the second fixed layer 32 were patterned. Next, the insulating material layer (embedded layer) 42 formed of silicon nitride (SiN), SiO₂, or Al₂O₃ was formed on the entire surface and a planarization process was applied thereto before the first fixed layer 31, the intermediate layer 22, the recording layer 21, and the cap layer 23 were formed on the entire surface. After that, the cap layer 23, the recording layer 21, the intermediate layer 22, and the first fixed layer 31 were patterned. It should be noted that each layer other than the intermediate layer was deposited with a DC magnetron sputtering method. The intermediate layer was formed by depositing an Mg layer with an RF magnetron sputtering method or a DC magnetron sputtering method before oxidizing the Mg layer in an oxidizing chamber. After the laminated structure 20 was obtained, heat treatment was performed at the temperature of 350° C. for 1 hour while applying a magnetic field in a heat treatment furnace. After that, the interlayer insulating layer 43 formed of Al₂O₃ was formed on the entire surface, an opening was formed in the interlayer insulating layer 43 on the upper side of the laminated structure 20, and the second wiring 52 that extended to the cap layer 23 was formed on the interlayer insulating layer 43. In this way, almost the same structure as that shown in FIG. 1A excluding the selection transistor TR was obtained.

Figure 15A:
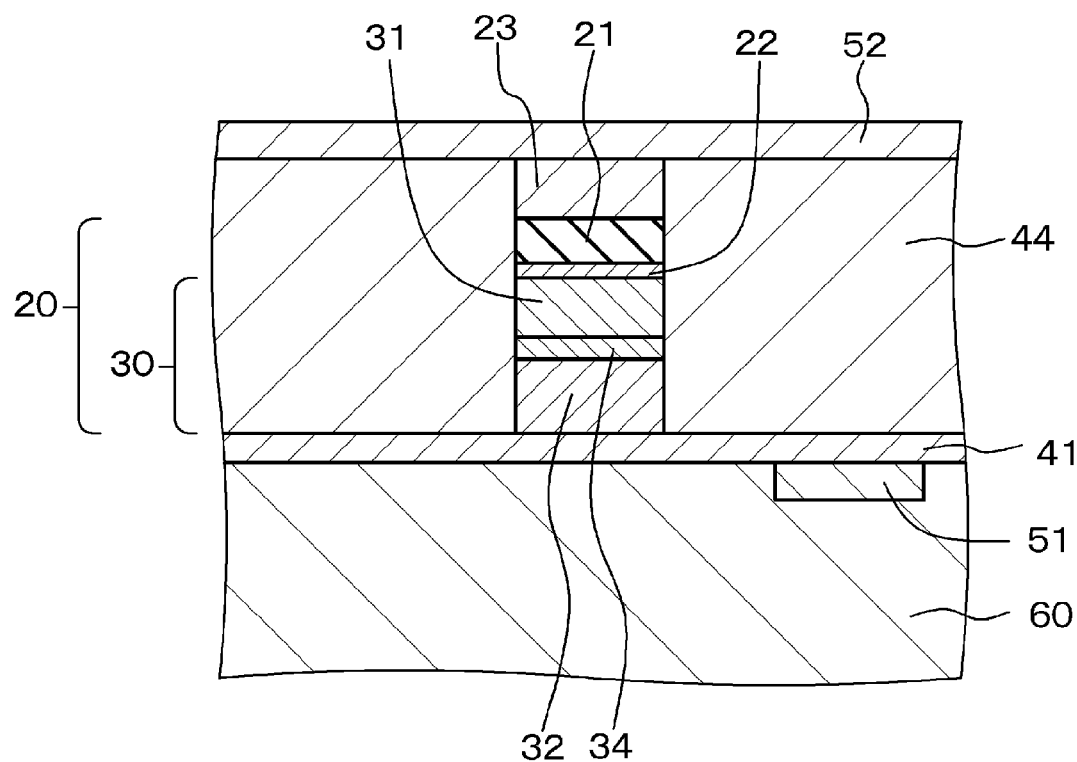
FIGS. 15A and 15B are schematic partial cross-sectional views showing magnetoresistive elements (spin injection-type magnetoresistive effect elements) in the comparative example 1A and the comparative example 1B, respectively.
Figure 15B:
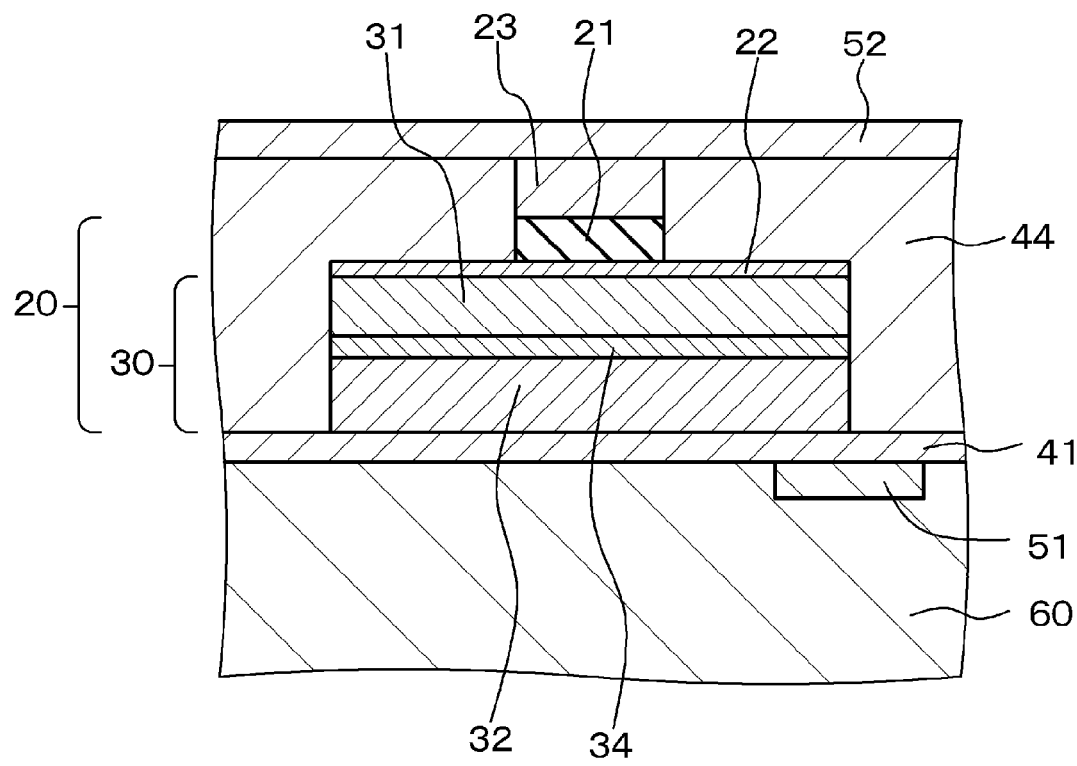

On the other hand, in preparing a sample in comparative examples, a thermally-oxidized film having a thickness of 0.3 μm (not shown) was formed on the surface of the silicon semiconductor substrate 60 having a thickness of 0.725 mm, the Cu layer (first wiring) 51 that functioned as a word line and had a film thickness of 0.1 μm was formed thereon, the layers constituting the laminated structure 20 shown in Table 1 were formed thereon before each layer was patterned. After the laminated structure 20 was obtained, heat treatment was performed at the temperature of 350'C for 1 hour while applying a magnetic field in a heat treatment furnace. After that, an interlayer insulating layer 44 formed of Al₂O₃ was formed on the entire surface, an opening was formed in the interlayer insulating layer 44 on the upper side of the laminated structure 20, and the second wiring 52 that extended to the cap layer 23 was formed on the interlayer insulating layer 44. It should be noted that in the comparative example 1A, the layers from the cap layer 23 to the second fixed layer 32 have a columnar shape (see FIG. 15A). On the other hand, in the comparative example 1B, the layers including the cap layer 23 and the recording layer 21 have an upper columnar shape, and the layers from the intermediate layer 22 to the second fixed layer 32 have a lower quadrangular prism shape (see FIG. 15B).

In the example 1, the comparative example 1A, and the comparative example 1B, the plane shape of the cap layer 23 and the recording layer 21 was a columnar shape with a diameter of 0.1 μm ($S_3$=0.0079 μm²). Moreover, in the example 1, the intermediate layer 22 and the first fixed layer 31 have a quadrangular prism shape with 2 μm×2 μm (=$S_1$), and the non-magnetic layer 34 and the second fixed layer 32 have a quadrangular prism shape of 0.5 μm×0.5 μm (=$S_2$). Moreover, in the comparative example 1A, the entire laminated structure 20 has a columnar shape with a diameter of 0.1 μm. Furthermore, in the comparative example 1B, the laminated structure (from the intermediate layer 22 to the second fixed layer 32) excluding the cap layer 23 and the recording layer 21 has a quadrangular prism shape of 2 μm×2 μm. Specifically, the values of $S_1$ and $S_2$ (unit: μm²)

in the example 1, the comparative example 1A, and the comparative example 1B are shown in the following table 2.

TABLE 2

|  | $S_1$ | $S_2$ | $S_1/S_2$ |
|---|---|---|---|
| Example 1 | 4 | 0.25 | 16 |
| Comparative example 1A | 0.01 | 0.01 | 1.00 |
| Comparative example 1B | 4 | 4 | 1.00 |

In the thus-obtained samples in the example 1, the comparative example 1A, and the comparative example 1B, the magnetic resistance was measured. In the measurement of the magnetic resistance, a magnetic field was wept in the range of 1.5 kOe to 3 kOe with respect to a film surface vertical direction, and the electrical resistance value was measured with a four-terminal method in the state where voltage of 100 mV was applied between the first wiring 51 and the second wiring 52.

As a result, in the example 1, the change in magnetic resistance was not recognized in the magnetic field range of ±2 kOe, and it had been found that the laminated structure in the example 1 had sufficient resistance to the external magnetic field of about 2.5 kOe. Moreover, in the comparative example 1A, the change in magnetic resistance was not recognized in the magnetic field range of ±3 kOe, and it had been found that the laminated structure in the comparative example 1A had sufficient resistance to the external magnetic field. On the other hand, in the comparative example 1B, the change in magnetic resistance was recognized in the magnetic field range of about 1.2 kOe, and it had been found that the laminated structure in the comparative example 1B did not have sufficient resistance to the external magnetic field.

The change in the resistance to the external magnetic field depending on the area of the first fixed layer (reference layer) 31 can be described as follows. Specifically, the magnetic material has a diamagnetic field in a direction opposite to the magnetization direction, and the diamagnetic field is a cause of interrupting a perpendicular magnetic anisotropy particularly in a perpendicular magnetization film. The diamagnetic field has an area dependency, is largest when the magnetic material is a solid film with the infinite size, and is reduced as the area of the magnetic material is reduced. Such a magnetic anisotropy effectively added due to the shape and size of the magnetic material is referred to as a shape magnetic anisotropy. The shape magnetic anisotropy is generally considered to have effects of reducing a diamagnetic field if the magnetic material is reduced in size to not more than 1 μm×1 μm. An anisotropy magnetic field Hc taking into account the shape magnetic anisotropy in the case where the magnetic material is reduced in size is represented by the following formula (1). Here, $K_u$ represents anisotropic energy, $M_s$ represents saturated magnetization, and f represents a diamagnetic field coefficient that changes depending on the shape of the magnetic material.

$$H_c = 2(K_u - 2\pi M_s^2 f)/M_s \tag{1}$$

Next, as described above, the second fixed layer (magnetization-fixed layers) 32 was formed with a Co—Pt alloy layer, and the change in anisotropy magnetic field due to the area of the second fixed layer 32 was calculated. Here, $M_s$ equals 600 emu/cm³, an anisotropy magnetic field $H^k$ in a solid film including a diamagnetic field equals 15 kOe, and the film thickness of the second fixed layer 32 equals 2 nm.

Figure 13:
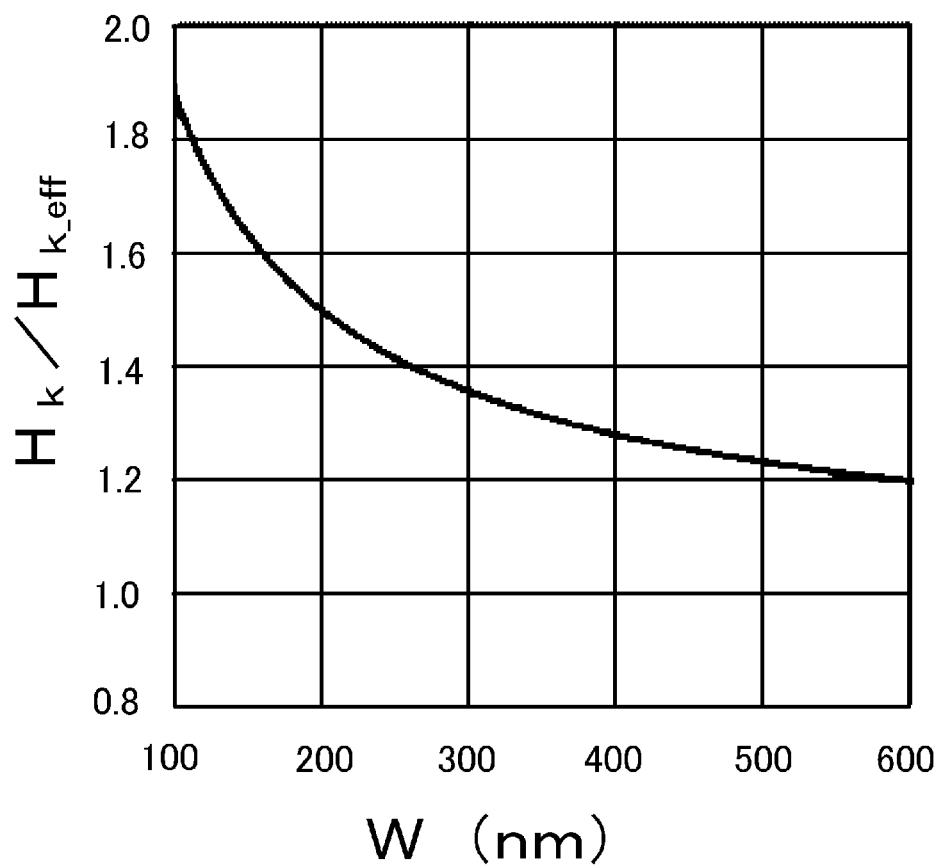
FIG. 13 is a graph showing the relationship between the size of the second fixed layer and an anisotropy magnetic field $H_k$ including a shape magnetic anisotropy.

FIG. 13 shows how the value of the anisotropy magnetic field Hk including a shape magnetic anisotropy changes with respect to the size of the second fixed layer 32 in the miniaturized second fixed layer 32 having the size of W (nm)×W (nm), if the anisotropy magnetic field $H_{k\_eff}$ is "1," when the second fixed layer 32 includes a solid film (W=∞). As the area of the second fixed layer (magnetization-fixed layers) 32 is reduced, the value of the anisotropy magnetic field $H_k$ is increased. As a result, the coupling energy of an anti-ferrimagnetic coupling in the laminated ferrimagnetic structure is increased. In addition, the anisotropy magnetic field is increased also as the state of the second fixed layer 32 changed from a multiple-domain structure to a single-domain structure due to the size reduction of the second fixed layer 32.

Figure 14:
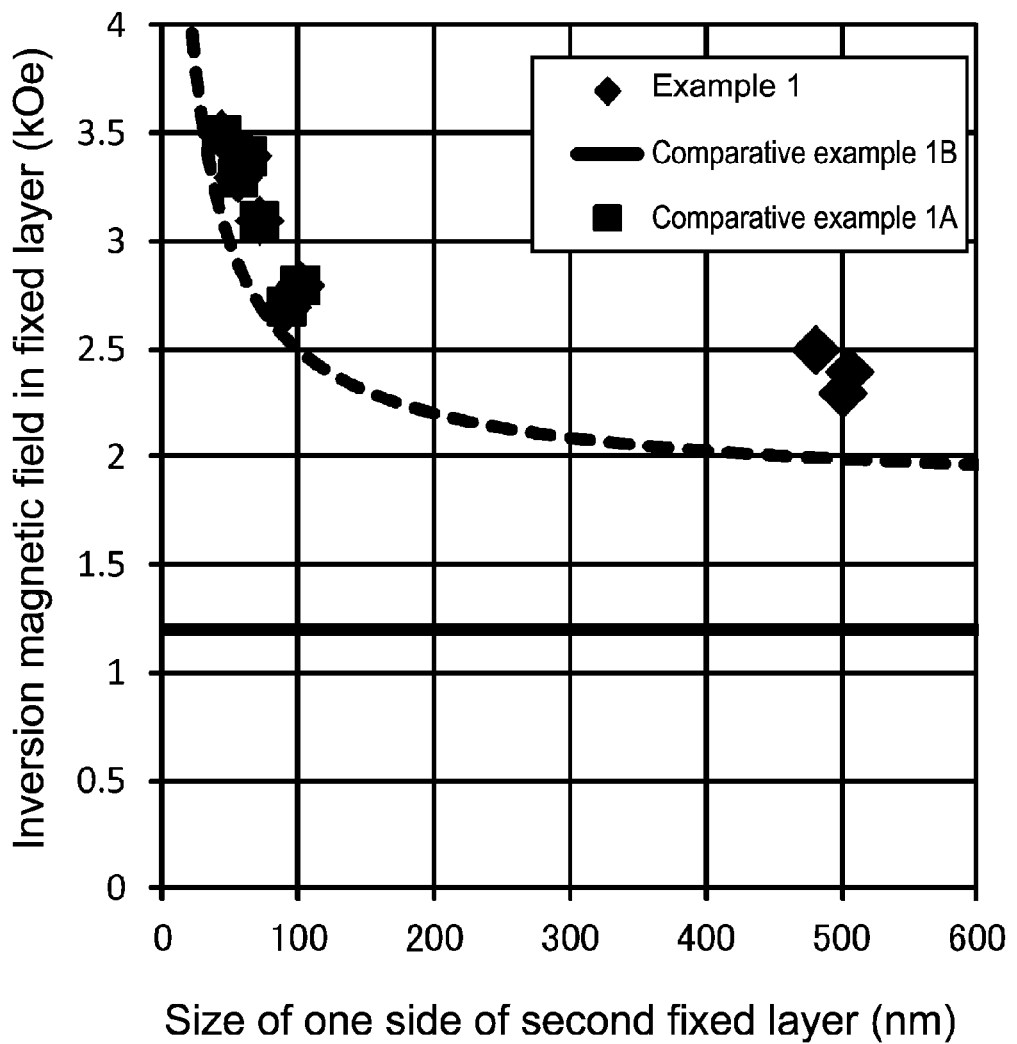
FIG. 14 is a graph showing the relationship between the size of the external magnetic field in which the fixed layers are inverted and the size of the second fixed layer in the example 1, a comparative example 1A, and a comparative example 1B.

Moreover, in the example 1, the comparative example 1A, and the comparative example 1B, the relationship between the size of the external magnetic field in which the fixed layers are inverted and the size of the second fixed layer (magnetization-fixed layers) 32 is obtained as shown in FIG. 14. It can be seen that in the example 1, the external magnetic field resistance of the fixed layers is increased. The size dependency of the second fixed layer 32 in the inversion magnetic field is similar to the size dependency of the anisotropy magnetic field of the second fixed layer 32 described above, which is considered to be obtained by reflecting the effects of an embodiment of the present disclosure.

However, in the device structure shown in the comparative example 1A, the area of the first fixed layer (reference layer) 31 is small and the volume of the first fixed layer 31 is small. Therefore, when current flows through the laminated structure 20 for a spin injection magnetization inversion (for recording information), unnecessary magnetization inversion is caused in the first fixed layer (reference layer) 31 by the spin torque received by the first fixed layer (reference layer) 31, which makes the operation of the magnetoresistive element unstable. On the other hand, in the example 1, because the area of the first fixed layer (reference layer) 31 is large although the area of the second fixed layer (magnetization-fixed layers) 32 is small, the first fixed layer (reference layer) 31 is stable with respect to the spin torque received during a spin injection magnetization inversion.

Resistance to the external magnetic field and the spin torque in the example 1, the comparative example 1A, and the comparative example 1B is collectively shown in the following table 3.

TABLE 3

|  | Example 1 | Comparative example 1A | Comparative example 1B |
|---|---|---|---|
| Area of the first fixed layer | Large | Small | Large |
| Area of the second fixed layer | Small | Small | Large |
| Volume of the plurality of fixed layers | Middle | Small | Large |
| Spin torque resistance | High | Low | High |
| External magnetic field resistance | High | High | Low |

As described above, in the magnetoresistive element in the example 1, a plurality of fixed layers are provided, and the following formula is satisfied: $S_1 > S_2$ ($S_1$ is an area of a portion of the first fixed layer adjacent to the intermediate layer, which faces the intermediate layer, and $S_2$ is an area of the fixed layer having the smallest area out of the fixed layers other than the first fixed layer). Therefore, the fixed layers have a sufficiently high external magnetic field resistance as a whole, and have a sufficiently high spin torque resistance than the recording layer.

EXAMPLE 2

The example 2 is a modification of the example 1. In the example 2, various modified example of the shape of the laminated structure will be described.

Figure 3A:
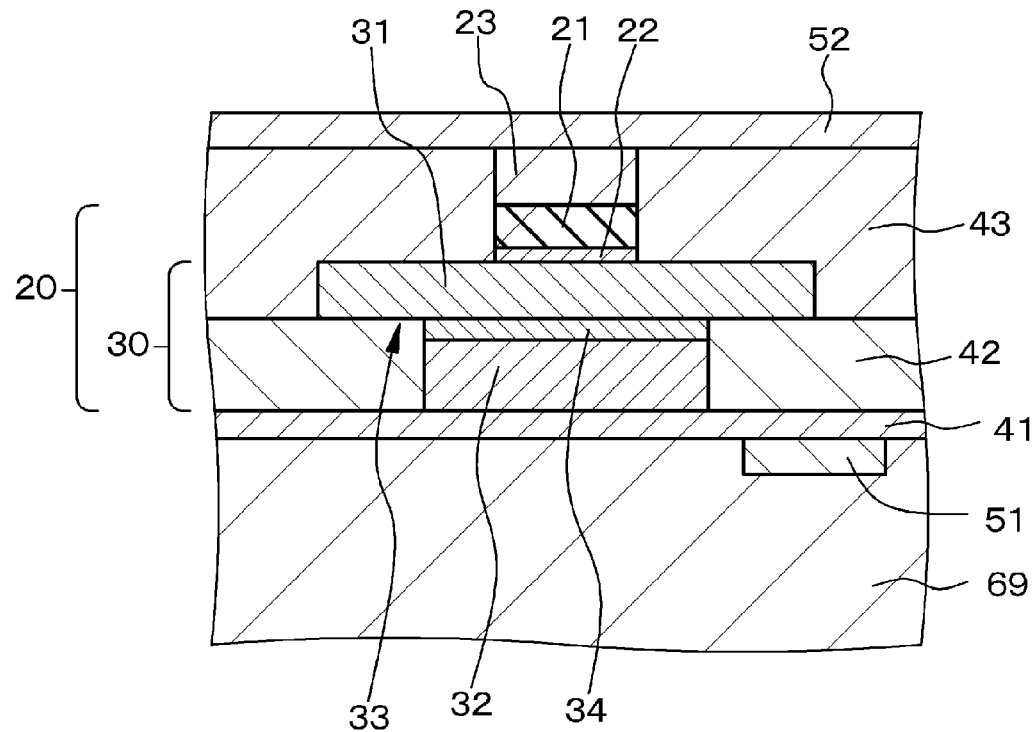
FIGS. 3A and 3B are each a schematic partial cross-sectional view showing a magnetoresistive element (spin injection-type magnetoresistive effect element) in an example 2.
Figure 3B:
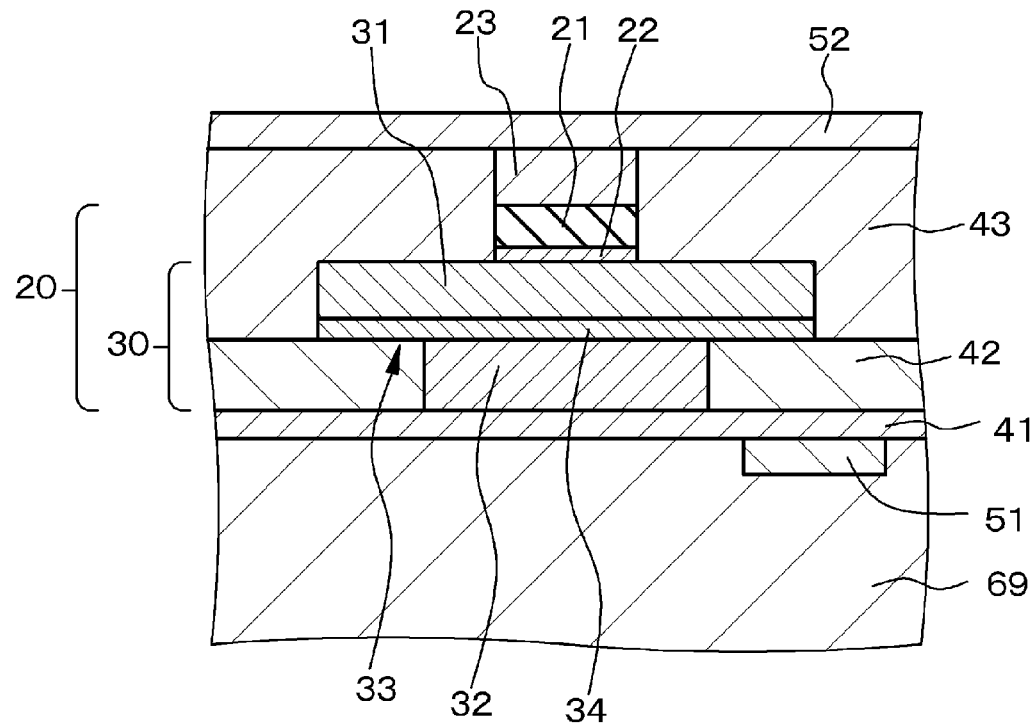

In the magnetoresistive element (spin injection-type magnetoresistive effect element) shown in the schematic partial cross-sectional views of FIG. 3A and FIG. 3B, the intermediate layer 22 has the same size as the recording layer 21. It should be noted that FIG. 3A shows a modification of the magnetoresistive element shown in FIG. 1A, and FIG. 3B shows a modification of the magnetoresistive element shown in FIG. 1B.

Figure 4A:
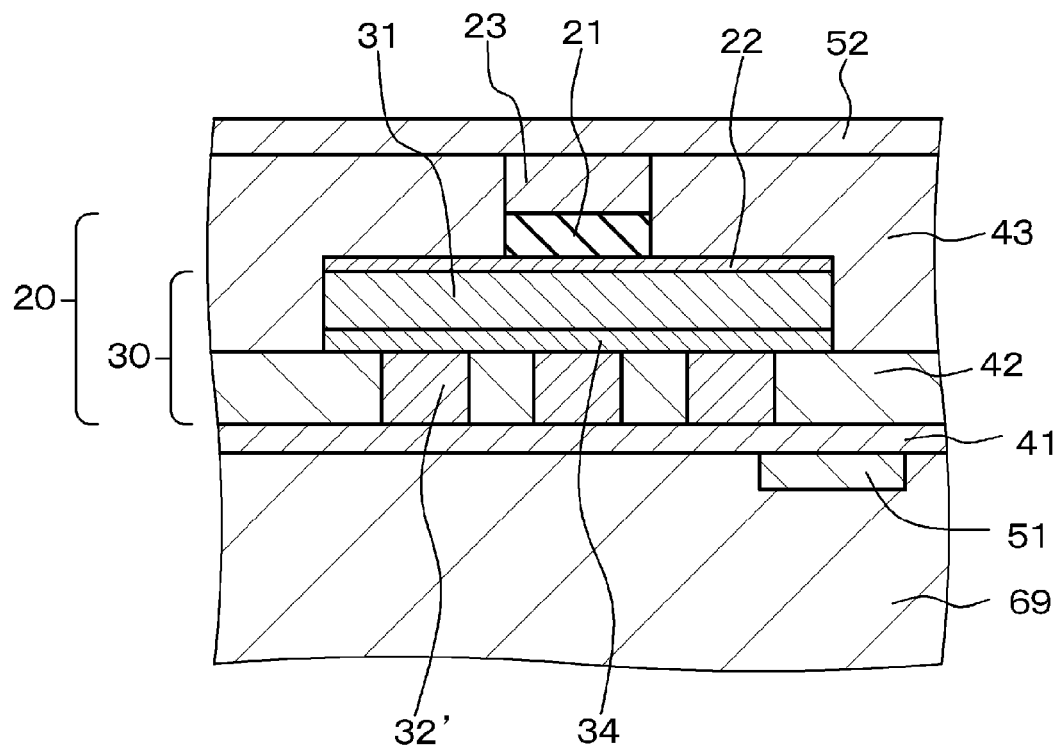
FIGS. 4A and 4B are each a schematic partial cross-sectional view showing a modified example of the magnetoresistive element (spin injection-type magnetoresistive effect element) in the example 2.
Figure 4B:
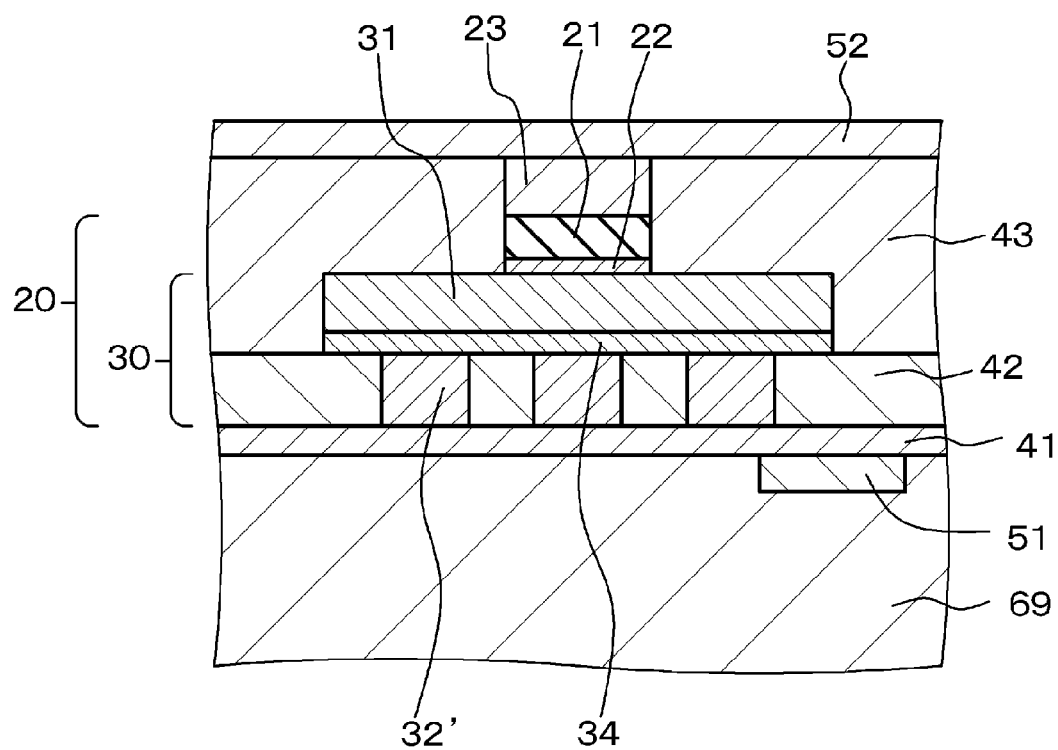

Moreover, in the magnetoresistive element (spin injection-type magnetoresistive effect element) shown in the schematic partial cross-sectional views of FIG. 4A and FIG. 4B, the fixed layers other than the first fixed layer are formed of a plurality (three in the figures) of arranged fixed layer units 32'. It should be noted that FIG. 4A shows a modification of the magnetoresistive element shown in FIG. 1B, and FIG. 4B shows a modification of the magnetoresistive element shown in FIG. 3B.

Figure 5A:
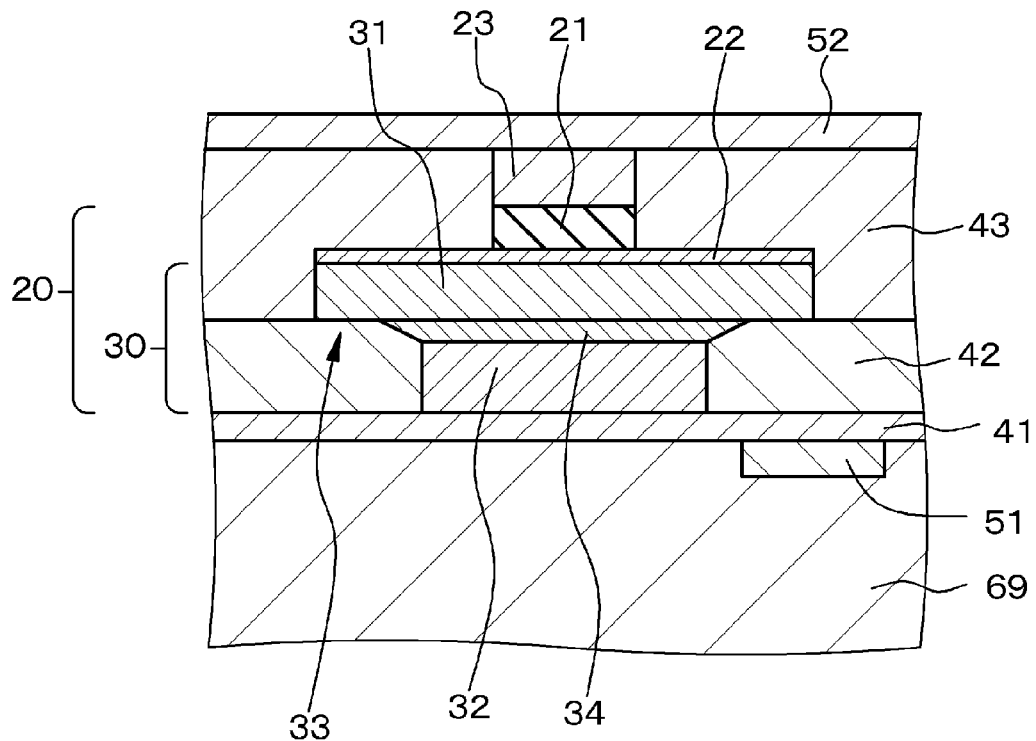
FIGS. 5A and 5B are each a schematic partial cross-sectional view showing another modified example of the magnetoresistive element (spin injection-type magnetoresistive effect element) in the example 2.
Figure 5B:
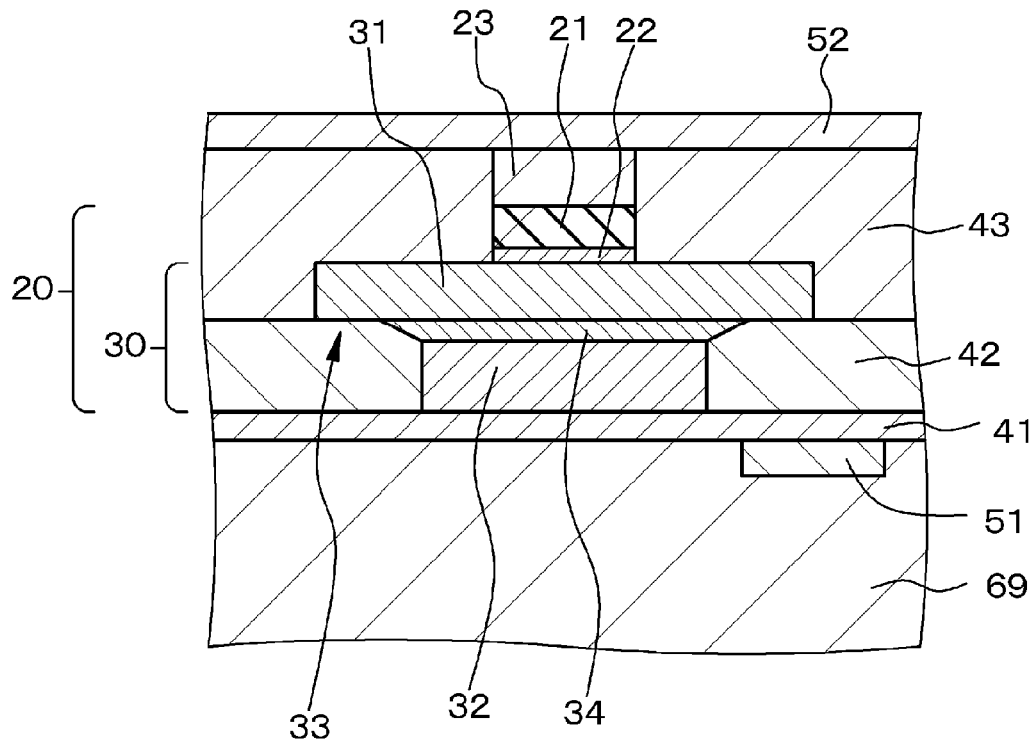

In the magnetoresistive element (spin injection-type magnetoresistive effect element) shown in the schematic partial cross-sectional views of FIG. 5A and FIG. 5B, the side surface of the non-magnetic layer 34 has a tapered shape that is narrowed toward the second fixed layer 32. It should be noted that FIG. 5A shows a modification of the magnetoresistive element shown in FIG. 1A, and FIG. 5B shows a modification of the magnetoresistive element (spin injection-type magnetoresistive effect element) shown in FIG. 3A.

Figure 6A:
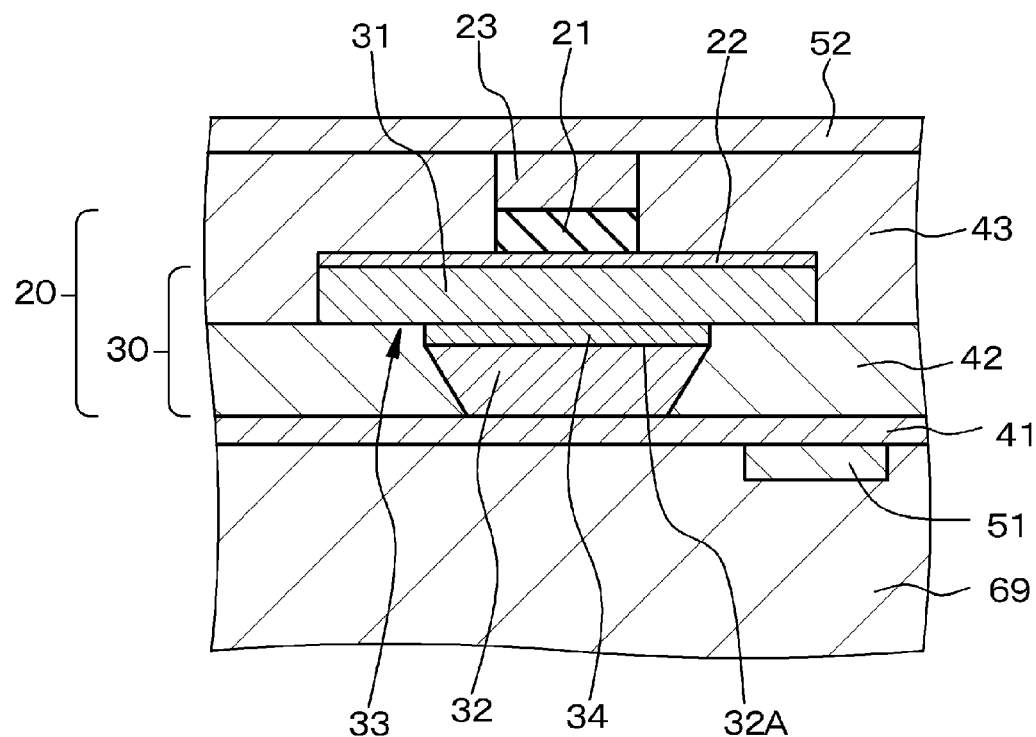
FIGS. 6A and 6B are each a schematic partial cross-sectional view showing another modified example of the magnetoresistive element (spin injection-type magnetoresistive effect element) in the example 2.
Figure 6B:
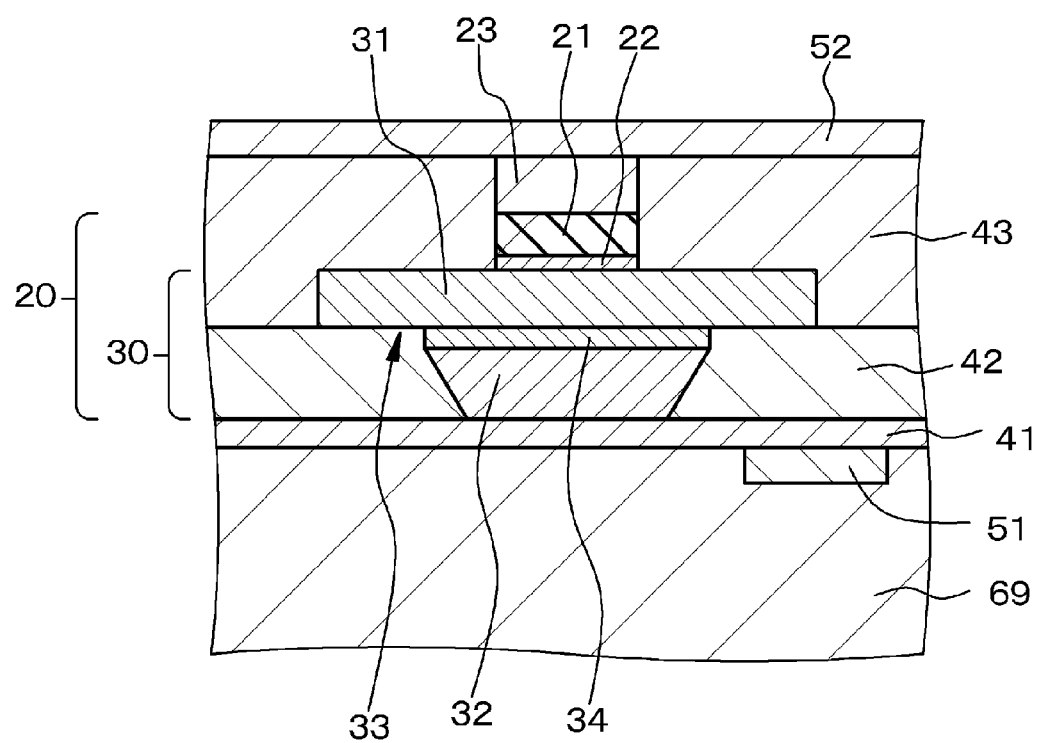

In the magnetoresistive element/(spin injection-type magnetoresistive effect element) shown in the schematic partial cross-sectional views of FIG. 6A and FIG. 6B, the side surface of the second fixed layer 32 has a tapered shape that is narrowed toward the underlying layer 41. It should be noted that FIG. 6A shows a modification of the magnetoresistive element shown in FIG. 1A, and FIG. 6B shows a modification of the magnetoresistive element (spin injection-type magnetoresistive effect element) shown in FIG. 3A.

Figure 7A:
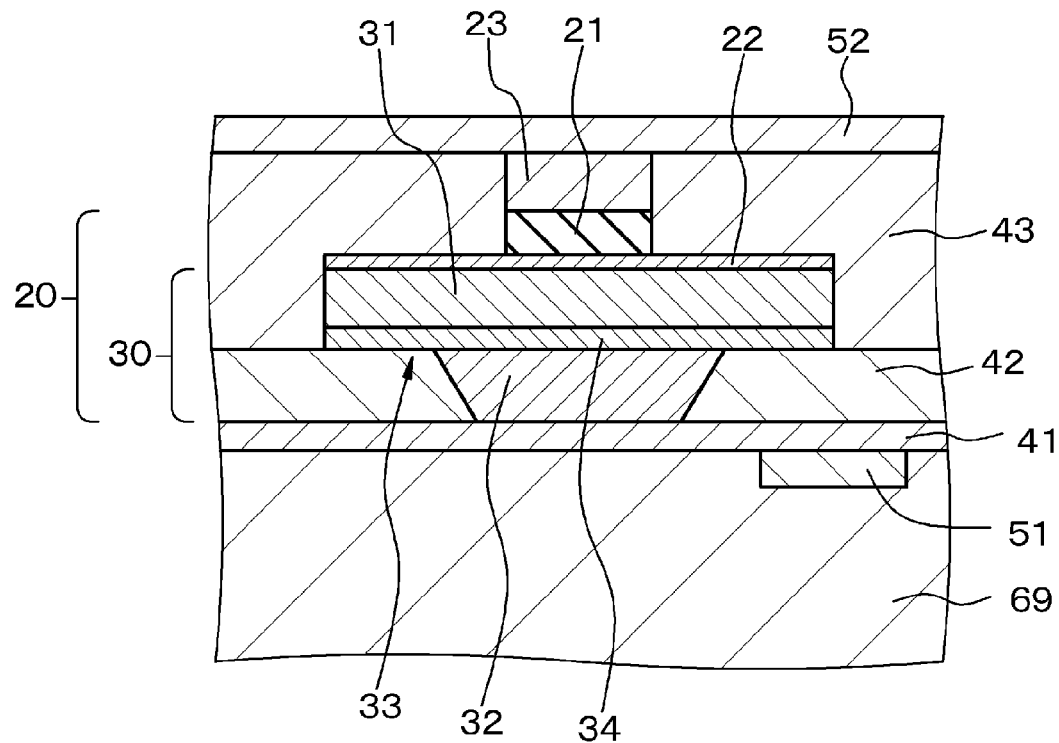
FIGS. 7A and 7B are each a schematic partial cross-sectional view showing another modified example of the magnetoresistive element (spin injection-type magnetoresistive effect element) in the example 2.
Figure 7B:
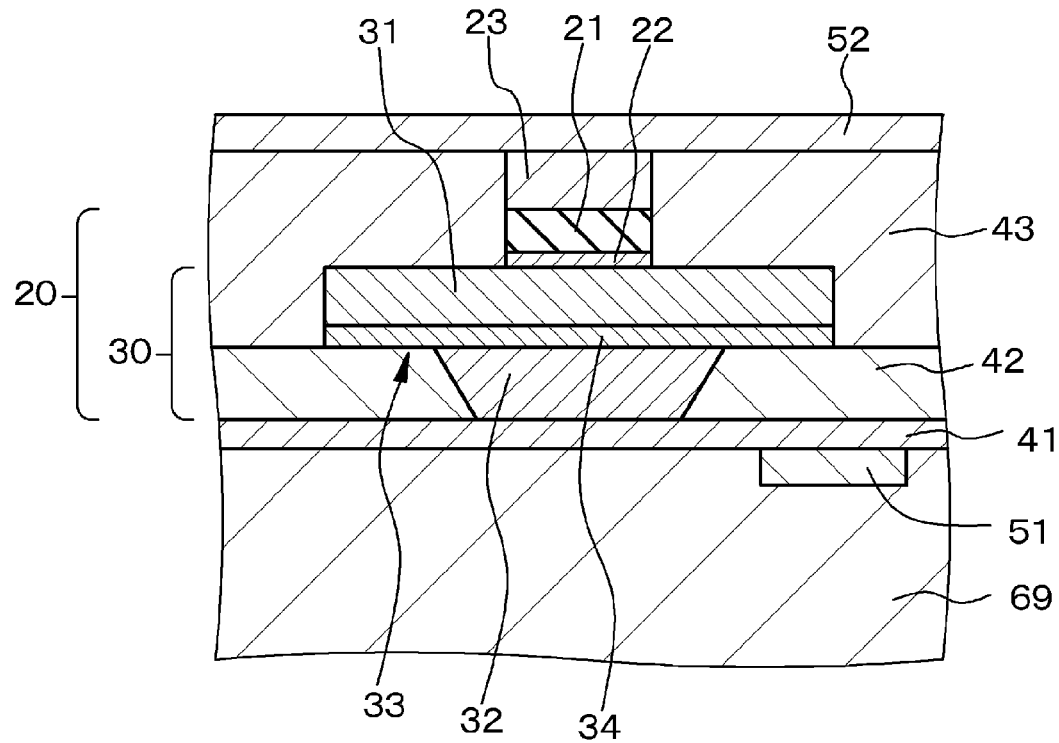

In the magnetoresistive element (spin injection-type magnetoresistive effect element) shown in the schematic partial cross-sectional views of FIG. 7A and FIG. 7B, the side surface of the second fixed layer 32 has a tapered shape that is narrowed toward the underlying layer 41. It should be noted that FIG. 7A shows a modification of the magnetoresistive element shown in FIG. 1B, and FIG. 7B shows a modification of the magnetoresistive element (spin injection-type magnetoresistive effect element) shown in FIG. 3B.

Figure 8A:
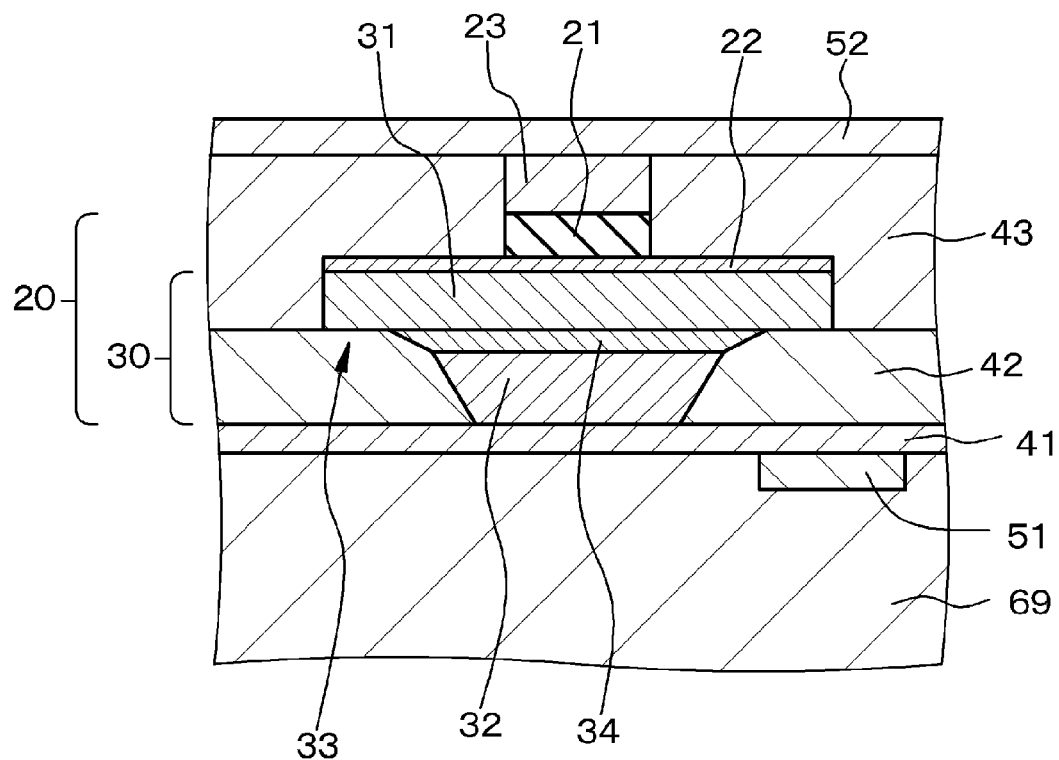
FIGS. 8A and 8B are each a schematic partial cross-sectional view showing another modified example of the magnetoresistive element (spin injection-type magnetoresistive effect element) in the example 2.
Figure 8B:
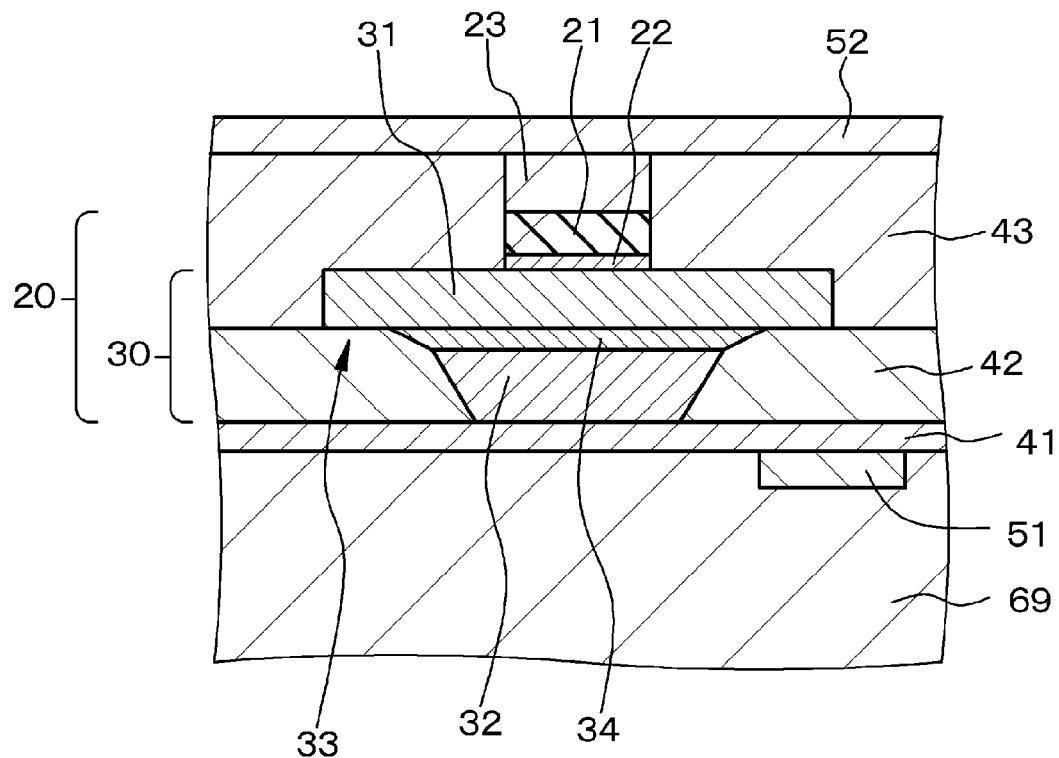

In the magnetoresistive element (spin injection-type magnetoresistive effect element) shown in the schematic partial cross-sectional views of FIG. 8A and FIG. 8B, the side surface of the non-magnetic layer 34 and the side surface of the second fixed layer 32 have a tapered shape that is narrowed toward the underlying layer 41. It should be noted that FIG. 8A shows a modification of the magnetoresistive element shown in FIG. 1A, and FIG. 8B shows a modification of the magnetoresistive element (spin injection-type magnetoresistive effect element) shown in FIG. 3A.

Figure 9A:
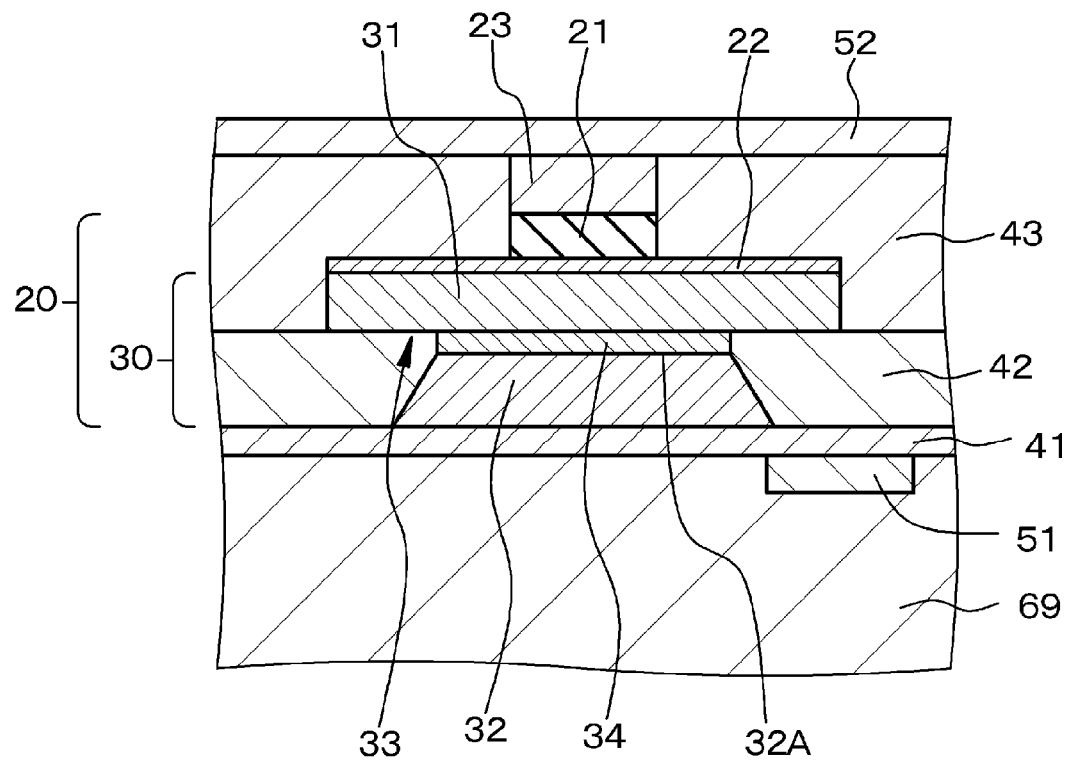
FIGS. 9A and 9B are each a schematic partial cross-sectional view showing another modified example of the magnetoresistive element (spin injection-type magnetoresistive effect element) in the example 2.
Figure 9B:
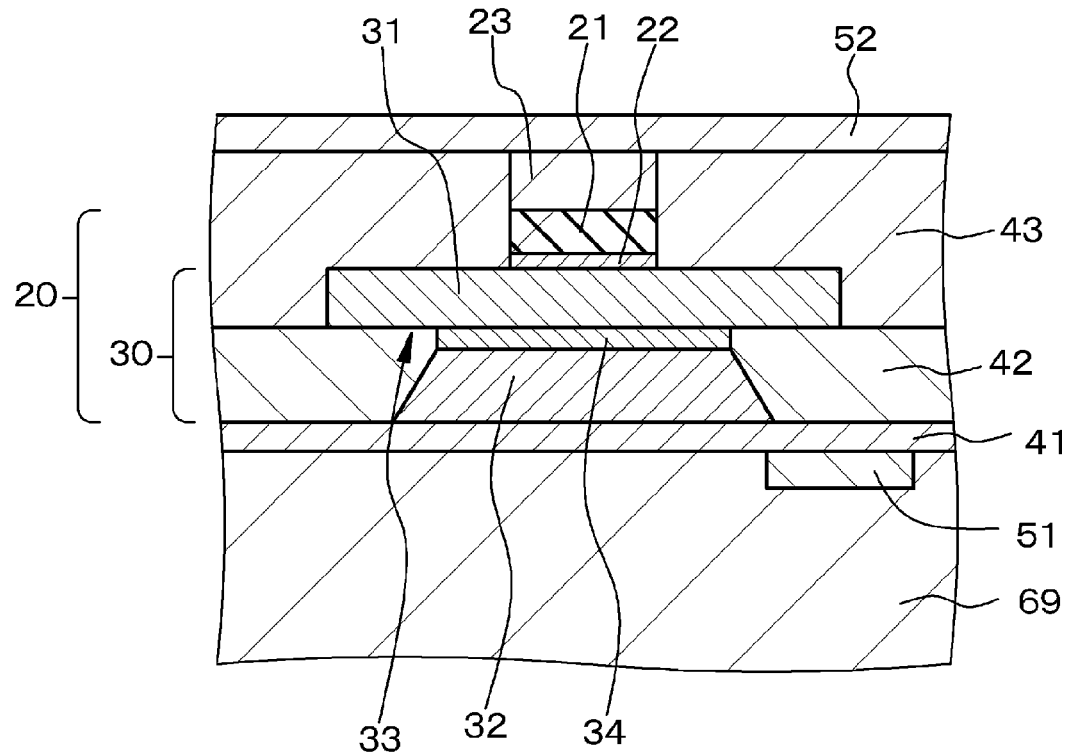

In the magnetoresistive element/(spin injection-type magnetoresistive effect element) shown in the schematic partial cross-sectional views of FIG. 9A and FIG. 9B, the side surface of the second fixed layer 32 has a tapered shape that is narrowed toward the underlying layer 41. It should be noted that FIG. 9A shows a modification of the magnetoresistive element shown in FIG. 1A, and FIG. 9B shows a modification of the magnetoresistive element (spin injection-type magnetoresistive effect element) shown in FIG. 3A.

Figure 10A:
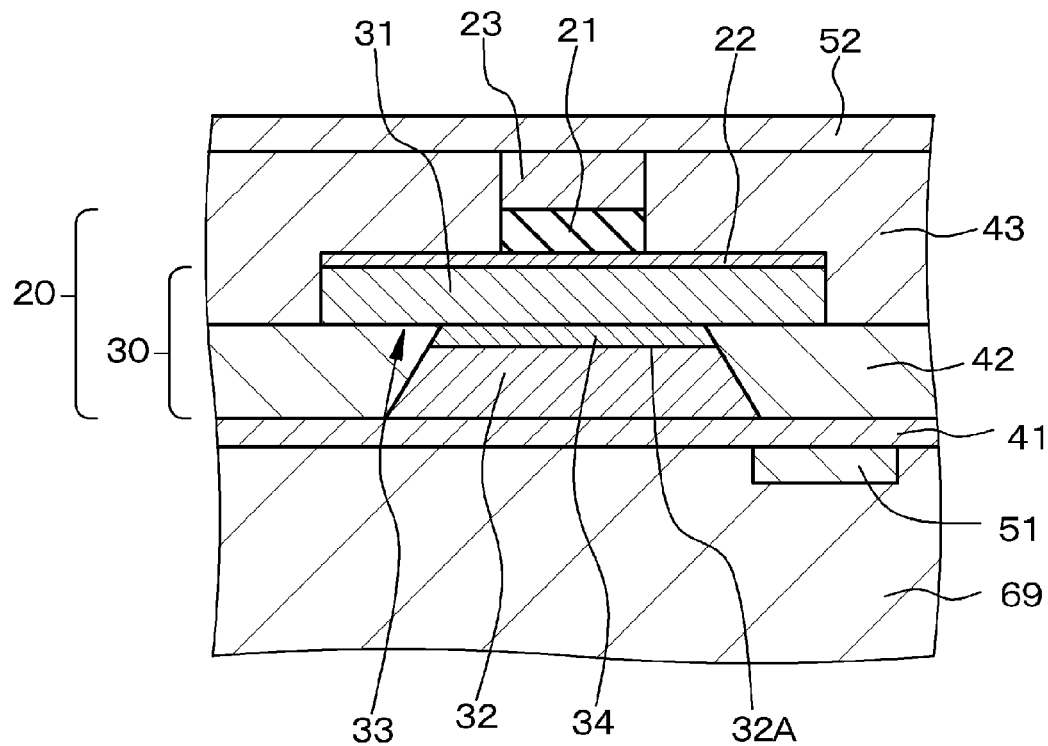
FIGS. 10A and 10B are each a schematic partial cross-sectional view showing another modified example of the magnetoresistive element (spin injection-type magnetoresistive effect element) in the example 2.
Figure 10B:
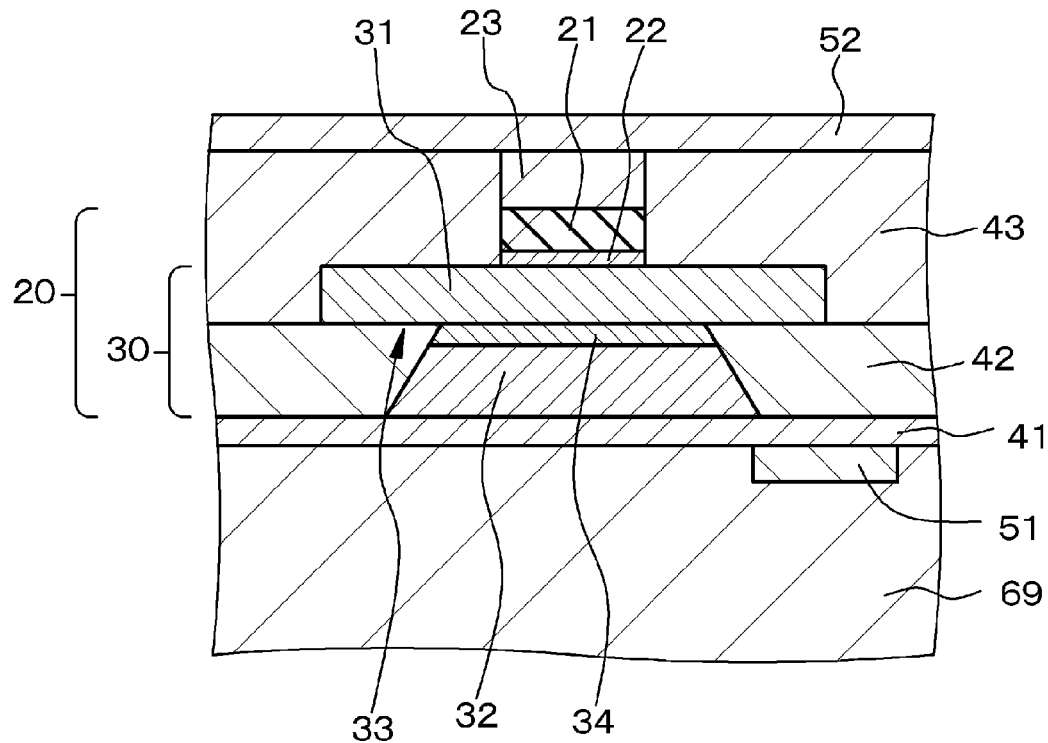

In the magnetoresistive element (spin injection-type magnetoresistive effect element) shown in the schematic partial cross-sectional views of FIG. 10A and FIG. 10B, the side surface of the non-magnetic layer 34 and the side surface of the second fixed layer 32 have a tapered shape that is widened toward the underlying layer 41. It should be noted that FIG. 10A shows a modification of the magnetoresistive element shown in FIG. 1A, and FIG. 10B shows a modification of the magnetoresistive element (spin injection-type magnetoresistive effect element) shown in FIG. 3A.

Figure 11A:
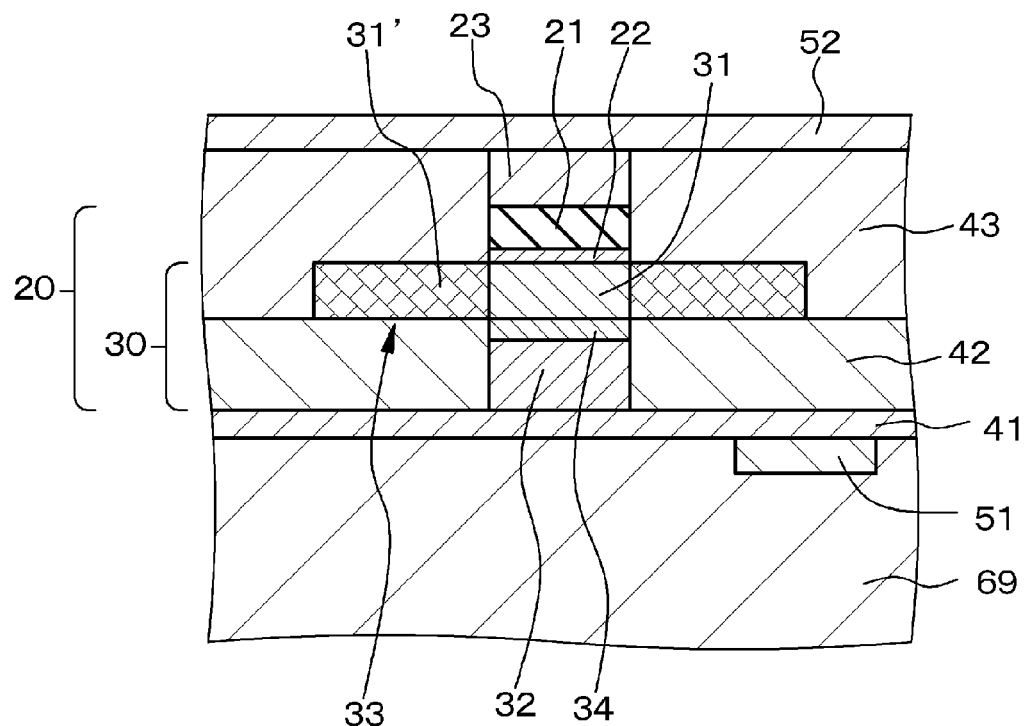
FIGS. 11A and 11B are each a schematic partial cross-sectional view showing another modified example of the magnetoresistive element (spin injection-type magnetoresistive effect element) in the example 2.
Figure 11B:
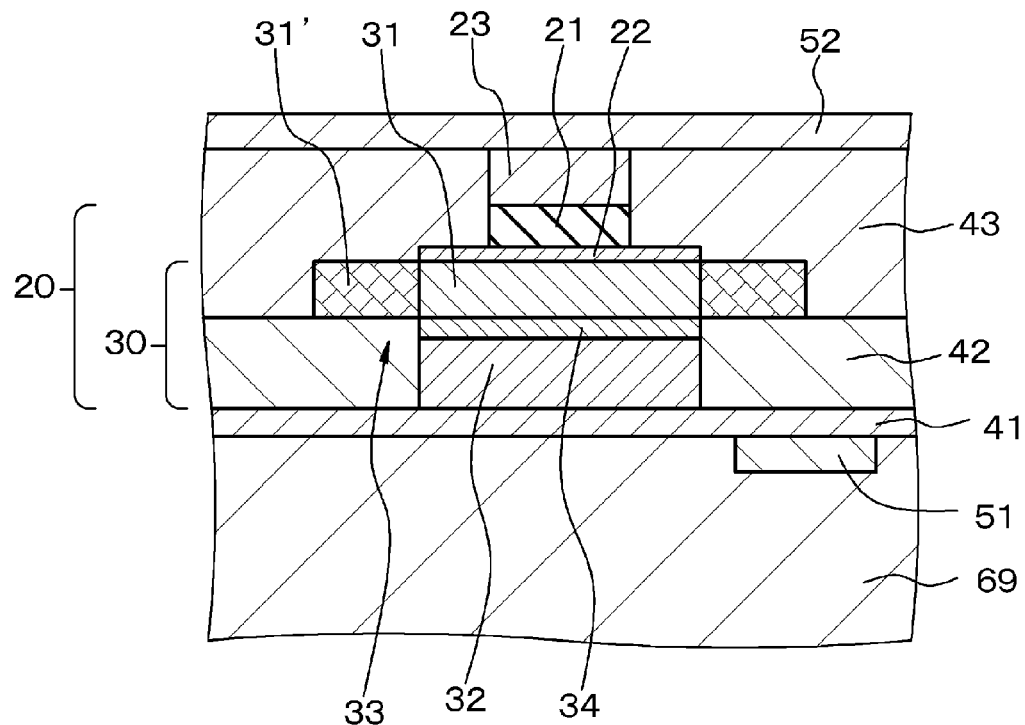
Figure 12:
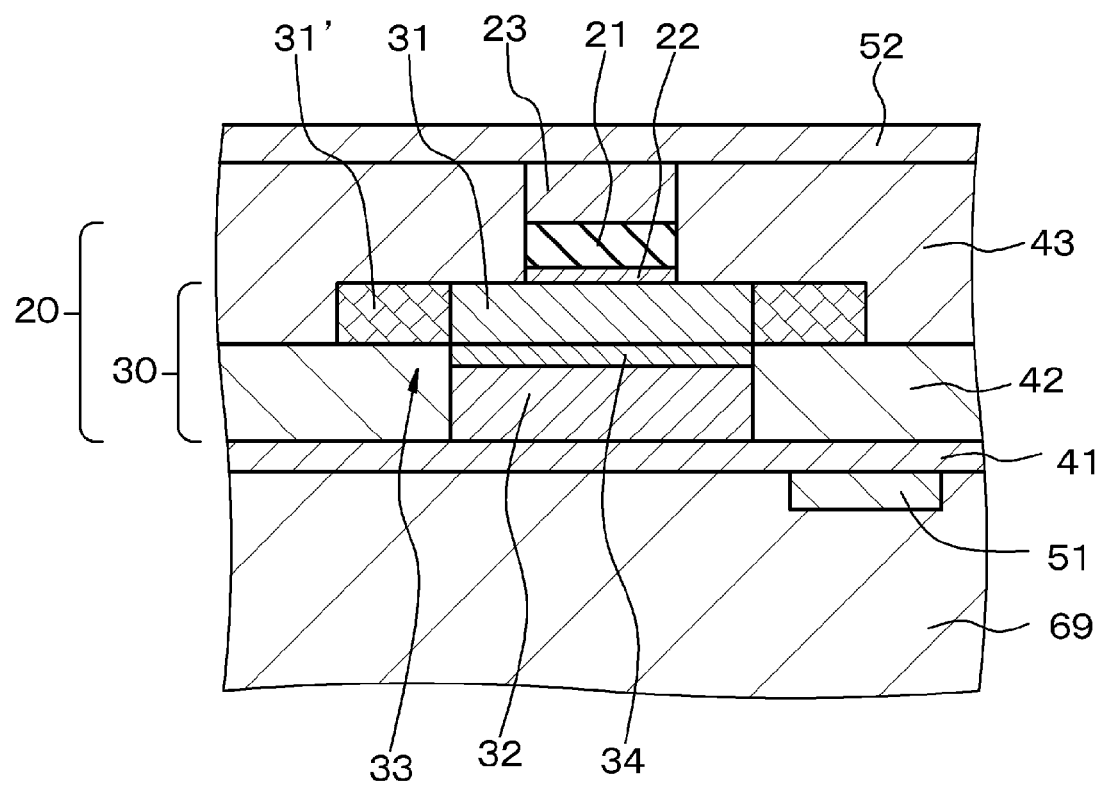
FIG. 12 is a schematic partial cross-sectional view showing another modified example of the magnetoresistive element (spin injection-type magnetoresistive effect element) in the example 2.

In the magnetoresistive element/(spin injection-type magnetoresistive effect element) shown in the schematic partial cross-sectional views of FIG. 11A, FIG. 11B, and FIG. 12, a first fixed layer extending portion 31' is provided on the outside of the first fixed layer 31. The first fixed layer extending portion 31' may be formed of the same material as that of the first fixed layer 31, or may be formed of a different ferrimagnetic material. In the magnetoresistive element shown in FIG. 11A, FIG. 11B, and FIG. 12, the second fixed layer 32, the non-magnetic layer 34, the first fixed layer 31, the intermediate layer 22, the recording layer 21, and the cap layer 23 having a columnar shape are formed before the insulating material layer 42, the first fixed layer extending portion 31', and the interlayer insulating layer 43 may be successively formed. It should be noted that depending on the patterning in the forming of the second fixed layer 32, the non-magnetic layer 34, the first fixed layer 31, the intermediate layer 22, the recording layer 21, and the cap layer 23 having a columnar shape, the magnetoresistive element shown in FIG. 11A, FIG. 11B, and FIG. 12 can be obtained.

Although embodiments of the present disclosure have been described based on the examples, the embodiments of the present disclosure are not limited to the examples. Various laminated structures, used materials, and the like described in the examples are given for exemplary purpose, and can be changed as appropriate. In each example, the spin injection-type magnetoresistive effect element in which the recording layer is located at the uppermost layer of the laminated structure has been described. However, the lamination order of the layers may be reversed, i.e., the spin injection-type magnetoresistive effect element may have a structure in which the recording layer is located at the lowermost layer. Moreover, in the examples, the perpendicular magnetization-type magnetoresistive element has been mainly described as an example. However, in the recording layer, an easy axis of magnetization may be vertical to the laminated direction of the laminated structure (i.e., in-plane magnetization-type). Moreover, the insulating material layer may have magnetic properties. In this case, the insulating material layer only needs to be formed of a ferric oxide ($FeO_x$), for example. Examples of the magnetoresistive element further include a magnetic head.

It should be noted that the present disclosure may also take the following configurations.

(A01) A magnetoresistive element, including
a laminated structure including
a plurality of fixed layers,
an intermediate layer formed of a non-magnetic material, and
a recording layer, the plurality of fixed layers being laminated via a non-magnetic layer, the plurality of fixed layers having at least a first fixed layer and a second fixed layer, the following formula being satisfied: $S_1 > S_2$ (wherein $S_1$ is an area of a portion of the first fixed layer adjacent to the intermediate layer, which faces the intermediate layer, and $S_2$ is an area of the fixed layer having the smallest area out of the fixed layers other than the first fixed layer).

(A02) The magnetoresistive element according to (A01) above, in which
the plurality of fixed layers have a laminated ferrimagnetic structure.

(A03) The magnetoresistive element according to (A01) or (A02) above, in which
the following formula is satisfied: $S_1/S_2 \geq 4$.

(A04) The magnetoresistive element according to any one of (A01) to (A03) above, in which
an uneven surface is formed between a surface of the first fixed layer that faces the second fixed layer and a surface of the second fixed layer that faces the first fixed layer.

(A05) The magnetoresistive element according to any one of (A01) to (A04) above, including
a memory element in which a magnetization direction of the recording layer changes corresponding to information to be recorded, a magnetization direction of the first fixed layer is one that is reference of information to be recorded in the recording layer, and the magnetization direction of the recording layer is changed by flowing current in a laminated direction of the laminated structure and information is recorded in the recording layer.

(A06) The magnetoresistive element according to any one of (A01) to (A05) above, in which
in the recording layer, an easy axis of magnetization is in parallel with the laminated direction of the laminated structure.

(A07) The magnetoresistive element according to any one of (A01) to (A05) above, in which
in the recording layer, an easy axis of magnetization is vertical to the laminated direction of the laminated structure.

(A08) The magnetoresistive element according to any one of (A01) to (A07) above, in which
an area of the recording layer is smaller than an area of the first fixed layer.

(A09) The magnetoresistive element according (A08) above, in which
the following formula is satisfied: $S_1/S_3 \geq 4$ ($S_3$ represent an area of the recording layer)

(A10) The magnetoresistive element according to any one of (A01) to (A09) above, in which
at least the second fixed layer is surrounded by an insulating material layer.

(A11). The magnetoresistive element according to (A10) above, in which
the insulating material layer has magnetic properties.

(A12) The magnetoresistive element according to any one of (A01) to (A11) above, in which
the non-magnetic layer that is in contact with the first fixed layer has the same size as the second fixed layer.

(A13) The magnetoresistive element according to any one of (A01) to (A11) above, in which the non-magnetic layer that is in contact with the first fixed layer has the same size as the first fixed layer.

(A14) The magnetoresistive element according to any one of (A01) to (A13), in which
the fixed layers other than the first fixed layer are formed of a plurality of arranged fixed layer units.

(A15) The magnetoresistive element according to any one of (A01) to (A14), in which
the first fixed layer is formed of any one of a laminated body of a Co layer and a Pt layer, a laminated body of a Co layer and a Pd layer, a laminated body of a Co layer and a Ni layer, a Co—Pt alloy layer, a Co—Pd alloy layer, a Co—Ni alloy layer, and a Co—Fe—B alloy layer.

(A16) The magnetoresistive element according to (A15) above, in which
the first fixed layer is formed of the Co—Fe—B alloy layer.

(A17) The magnetoresistive element according to any one of (A01) to (A16) above, in which
the intermediate layer is formed of a magnesium oxide.

(A18) The magnetoresistive element according to any one of (A01) to (A17) above, in which
the recording layer is formed of a Co—Fe—B alloy layer.

It should be understood by those skilled in the art that various modifications, combinations, sub-combinations and alterations may occur depending on design requirements and other factors insofar as they are within the scope of the appended claims or the equivalents thereof.

What is claimed is:

1. A magnetoresistive element, comprising
a laminated structure including
a plurality of fixed layers,
an intermediate layer formed of a non-magnetic material, and
a recording layer, the plurality of fixed layers being laminated via a non-magnetic layer, the plurality of fixed layers having at least a first fixed layer and a second fixed layer, the plurality of fixed layers together having a stepped profile such that the following formula is satisfied: $S_1 > S_2$ (wherein $S_1$ is an area of a portion of the first fixed layer adjacent to the intermediate layer, which faces the intermediate layer, and $S_2$ is an area of a layer of the plurality of fixed layers having the smallest area out of the plurality of fixed layers not including the first fixed layer),
wherein an uneven surface is formed between a surface of the first fixed layer that faces the second fixed layer and a surface of the second fixed layer that faces the first fixed layer.

2. The magnetoresistive element according to claim 1, wherein
the plurality of fixed layers have a laminated ferrimagnetic structure.

3. The magnetoresistive element according to claim 1, wherein
the following formula is satisfied: $S_1/S_2 \geq 4$.

4. The magnetoresistive element according to claim 1, comprising
a memory element in which a magnetization direction of the recording layer changes corresponding to information to be recorded, a magnetization direction of the first fixed layer is one that is reference of information to be recorded in the recording layer, and the magnetization direction of the recording layer is changed by flowing current in a laminated direction of the laminated structure and information is recorded in the recording layer.

5. The magnetoresistive element according to claim 1, wherein
in the recording layer, an easy axis of magnetization is in parallel with the laminated direction of the laminated structure.

6. The magnetoresistive element according to claim 1, wherein
in the recording layer, an easy axis of magnetization is vertical to the laminated direction of the laminated structure.

7. The magnetoresistive element according to claim 1, wherein
an area of the recording layer is smaller than an area of the first fixed layer.

8. The magnetoresistive element according to claim 1, wherein
at least the second fixed layer is surrounded by an insulating material layer.

9. The magnetoresistive element according to claim 8, wherein
the insulating material layer has magnetic properties.

10. The magnetoresistive element according to claim 1, wherein
the non-magnetic layer that is in contact with the first fixed layer has the same size as the second fixed layer.

11. The magnetoresistive element according to claim 1, wherein
the non-magnetic layer that is in contact with the first fixed layer has the same size as the first fixed layer.

12. The magnetoresistive element according to claim 1, wherein
the fixed layers other than the first fixed layer are formed of a plurality of arranged fixed layer units.

13. The magnetoresistive element according to claim 1, wherein
the first fixed layer is formed of any one of a laminated body of a Co layer and a Pt layer, a laminated body of a Co layer and a Pd layer, a laminated body of a Co layer and a Ni layer, a Co—Pt alloy layer, a Co—Pd alloy layer, a Co—Ni alloy layer, and a Co—Fe—B alloy layer.

14. The magnetoresistive element according to claim 13, wherein
the first fixed layer is formed of the Co—Fe—B alloy layer.

15. The magnetoresistive element according to claim 1, wherein
the intermediate layer is formed of a magnesium oxide.

16. The magnetoresistive element according to claim 1, wherein
the recording layer is formed of a Co—Fe—B alloy layer.

* * * * *